United States Patent [19]
Oozu et al.

[11] Patent Number: 5,801,373
[45] Date of Patent: Sep. 1, 1998

[54] SOLID-STATE IMAGE PICKUP DEVICE HAVING A PLURALITY OF PHOTOELECTRIC CONVERSION ELEMENTS ON A COMMON SUBSTRATE

[75] Inventors: Hayao Oozu, Fuchu; Mamoru Miyawaki, Isehara; Akira Ishizaki; Shigetoshi Sugawa, both of Atsugi, all of Japan

[73] Assignee: Canon Kabushiki Kaisha, Tokyo, Japan

[21] Appl. No.: 950,176

[22] Filed: Oct. 14, 1997

Related U.S. Application Data

[60] Continuation of Ser. No. 444,030, May 18, 1995, abandoned, which is a division of Ser. No. 174,444, Dec. 28, 1993, Pat. No. 5,453,611.

[30] Foreign Application Priority Data

| Jan. 1, 1993 | [JP] | Japan | 5-15082 |
| Jan. 1, 1993 | [JP] | Japan | 5-15086 |
| Jan. 19, 1993 | [JP] | Japan | 5-6983 |

[51] Int. Cl.$^6$ .................................................. H01J 40/14
[52] U.S. Cl. .......................... 250/208.1; 250/226; 358/514
[58] Field of Search ...................... 250/208.1, 226, 250/578.1; 358/513–515, 494; 257/440, 446

[56] References Cited

U.S. PATENT DOCUMENTS

| 4,663,656 | 5/1987 | Elabd et al. | 358/75 |
| 4,791,469 | 12/1988 | Ohmi et al. | 357/30 |
| 5,453,611 | 9/1995 | Oozu et al. | 250/208.1 |

FOREIGN PATENT DOCUMENTS

| 59-225564 | 12/1984 | European Pat. Off. |
| 60-018073 | 1/1985 | European Pat. Off. |
| 61-226955 | 10/1986 | European Pat. Off. |
| 61-244062 | 10/1986 | European Pat. Off. |
| 61-248553 | 11/1986 | European Pat. Off. |
| 62-174716 | 7/1987 | European Pat. Off. |
| 63-167577 | 7/1988 | European Pat. Off. |

*Primary Examiner*—Stephone B. Allen
*Attorney, Agent, or Firm*—Fitzpatrick Cella Harper & Scinto

[57] ABSTRACT

In a solid-state image pickup device this invention, in order to satisfactorily detect optical signals over a wide spectrum range from a visible light range to an invisible light range, a photoelectric conversion element for converting an optical signal in the invisible light range into an electrical signal, and photoelectric conversion elements for converting an optical signal in the visible light range into an electrical signal are formed on a common semiconductor chip.

8 Claims, 38 Drawing Sheets

INFRARED LIGHT CUT FILTER SPECTRUM PROPERTY

B-FILTER SPECTRUM PROPERTY

SOLID-STATE IMAGE PICKUP DEVICE HAVING A PLURALITY OF PHOTOELECTRIC CONVERSION ELEMENTS ON A COMMON SUBSTRATE

This application is a continuation of application Ser. No. 08/444,030 filed May 18, 1995, now abandoned, which is a division of application Ser. No. 08/174,444, filed Dec. 28, 1993, U.S. Pat. No. 5,453,611.

BACKGROUND OF THE INVENTION

1. Field of the Invention

The present invention relates to a solid-state image pickup device such as an optical sensor used in an image information processing apparatus such as a facsimile apparatus, an image scanner, a copying machine, an image sensor, or the like and, more particularly, to a solid-state image pickup device which converts not only visible light but also light in a invisible light range into an electrical signal.

2. Related Background Art

As a conventional solid-state image pickup device, a charge-coupled device (CCD) type device, a MOS type device, or an amplification type device in which a capacitive load is connected to the emitter of a phototransistor (U.S. Pat. No. 4,791,469 to Tadahiro Omi and Nobuyoshi Tanaka) is known.

Recently, solid-state image pickup devices have been used in various applications, and demand has arisen for a solid-state image pickup device having novel functions.

For example, recognition of a invisible image and reproduction and recording of the recognized image are required in addition to requirements for realizing a color copying machine with high image quality.

Such an image, i.e., a invisible light image includes, for example, an image formed by an ink having properties for absorbing infrared rays.

In general, a sensor for detecting invisible light is an independent device, and when it is used together with a sensor for detecting visible light, a new design concept is required.

The present inventors found, as a basic design concept, a technique for monolithically forming a visible light sensor and a invisible light sensor on a single semiconductor chip.

However, the above-mentioned techniques have room for further improvement.

SUMMARY OF THE INVENTION

It is an object of the present invention to provide a compact solid-state image pickup device, which can satisfactorily detect optical signals over a wide wavelength range from a visible light range to a invisible light range.

In order to achieve the above object, according to one aspect of the present invention, there is provided a solid-state image pickup device for photoelectrically converting an optical signal into an electrical signal, wherein a plurality of first photoelectric conversion elements for converting an optical signal in a visible light range into a first electrical signal including a plurality of color separation signals, and a second photoelectric conversion element for converting an optical signal in an invisible light range into a second electrical signal are arranged on a single substrate, and first element isolation means among the plurality of first photoelectric conversion elements and second element isolation means between the first and second photoelectric conversion elements have different structures.

Since element isolation can be performed in accordance with different carrier generation positions corresponding to different wavelengths, the element isolation can be effectively performed without decreasing the resolution.

In this aspect, an isolation structure among the first photoelectric conversion elements for converting an optical signal in a visible light range into a plurality of color separation signals is designed to be different from an isolation structure between the second photoelectric conversion element for converting an optical signal in an invisible light range into an electrical signal, and the first photoelectric conversion elements.

With this arrangement, a visible light signal and an invisible light signal can be efficiently obtained, and a crosstalk between these two signals can be eliminated. In this manner, a high-performance solid-state image pickup device, which can satisfactorily detect optical signals over a wide range from a visible light range to an invisible light range, can be provided.

In order to achieve the above object, according to another aspect of the present invention, there is provided an image sensor in which a plurality of filters are stacked on a light-receiving portion, and which photoelectrically converts an optical signal into an electrical signal, wherein a plurality of sensor arrays including a plurality of photoelectric conversion elements for converting an optical signal in a visible light range into an electrical signal by color-separating the optical signal, and a sensor array including a plurality of photoelectric conversion elements for converting an optical signal in an invisible light range into an electrical signal are arranged parallel to each other.

According to this aspect, since the visible light photoelectric conversion elements having the multi-layered filters and the invisible light photoelectric conversion elements are arranged in different lines, color separation signals can be easily detected by a compact device using a common semiconductor.

In order to achieve the above object, according to still another aspect of the present invention, there are provided an optical sensor wherein a second photoelectric conversion element for converting an optical signal in a visible light range into an electrical signal is stacked on a first photoelectric conversion element for converting an optical signal in an invisible light range into an electrical signal, and an image information processing apparatus comprising an optical sensor in which a second photoelectric conversion element for converting an optical signal in a visible light range into a second electrical signal is stacked on a first photoelectric conversion element for converting an optical signal in an invisible light range into a first electrical signal, discrimination means for discriminating the first electrical signal on the basis of a reference signal, image forming means for forming an image on the basis of the second electrical signal, and control means for controlling an operation of the image forming means on the basis of an output from the discrimination means.

According to this aspect, since a sensor element having selective sensitivity to visible light is formed on a sensor element having selective sensitivity to invisible light, a visible light signal and an invisible light signal at the same position can be read without using any special optical means or adopting any special arrangement.

According to this aspect, the visible light photoelectric conversion element (visible light sensor) and the invisible light photoelectric conversion element (invisible light sensor) are stacked. Therefore, a compact, high-performance optical sensor, which can detect optical signals over a wide range including an invisible light range and a visible light range, can be provided.

As the photoelectric conversion element of this aspect, a photovoltaic effect element or a photoconductive element such as a photodiode, a phototransistor, or the like is preferably used. As the photoelectric conversion element for converting an optical signal in the visible light range into an electrical signal, an element consisting of a material which transmits light in a required invisible light range, and can selectively absorb only an optical signal in the visible light range, is used.

More specifically, in order to transmit required invisible light, and to obtain a black-and-white signal, the material of the element is selected to have selective sensitivity in a wavelength range from 400 nm to 700 nm as the visible light range. In order to obtain an optical signal in a specific range of the visible light range, an element consists of a material which transmits required invisible light, and has selective sensitivity to the specific range, or the element comprises a filter for selectively transmitting light in the invisible light range and the specific range.

Alternatively, a position of a semiconductor junctions such as PN junction of the phototransistor or the photodiode is changed to provide a sensitivity in the selective wavelength region.

In order to obtain color signals, e.g., red (R), green (G), and blue (B) signals, a plurality of different elements including an element (R element) having selective sensitivity to an R range (e.g., a wavelength range from 580 nm to 700 nm), an element (G element) having selective sensitivity to a G range (e.g., a wavelength range from 480 nm to 580 nm), and an element (B element) having selective sensitivity to a B range (e.g., a wavelength range from 400 nm to 480 nm), are used.

Of course, in this case, each of the R, G, and B elements may consist of a material for selectively absorbing light in the R, G, or B range, i.e., having selective sensitivity to the corresponding range, and for transmitting required invisible light, or an element which transmits required invisible light, and has sensitivity to all the R, G, and B ranges may comprise filters for transmitting required visible light, and selectively transmitting corresponding light components in the R, G, and B ranges.

On the other hand, as the photoelectric conversion element for converting an optical signal in an invisible light range into an electrical signal, for example, an element having selective sensitivity to ultraviolet rays or infrared rays is used. In this case, the element consists of a material having selective sensitivity to light in the selected in light range.

The visible light range and the invisible light range, or the R, G, and B wavelength ranges in this aspect are not clearly distinguished from each other by wavelength values, and the photoelectric conversion elements used in this aspect need only be designed to photoelectrically convert any of ultraviolet, blue, green, red, and infrared light components in required amounts so as to obtain required signals, and not to photoelectrically convert unnecessary light in practice. Alternatively, instead of R, G, and B, yellow(Y), magenta (M) and cyan(C) may be used.

The optical sensor of this aspect can constitute a color line sensor or a color area sensor by periodically arranging photoelectric conversion elements. Preferably, a unit pixel at a resolution of a color signal is designed to include an element (R element) having selective sensitivity to the R range, an element (G element) having selective sensitivity to the G range, and an element (B element) having selective sensitivity to the B range.

An image which generates an optical signal to be detected includes a three-dimensional image or a two-dimensional image. A typical two-dimensional image is a planar image such as an original. Therefore, when the optical sensor is used in a system for reading an original image, it is preferable to arrange illumination means for illuminating an original surface. The illumination means includes a light-emitting diode, or a light source such as a xenon lamp, a halogen lamp, or the like. The light source need only generate light in a required wavelength range in accordance with an optical signal to be detected.

DETAILED DESCRIPTION OF THE PREFERRED EMBODIMENTS

Prior to the description of an element isolation structure used in this embodiment, an arrangement of first and second photoelectric conversion elements as a presupposition will be exemplified below.

Figure 1:
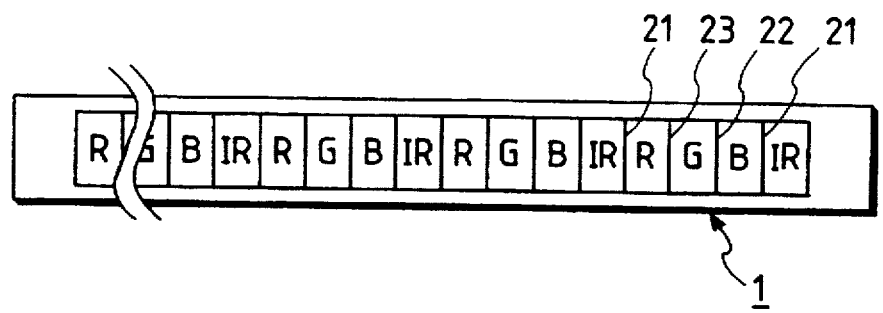
FIG. 1 is a plan view of a solid-state image pickup device according to one aspect of the present invention.

On the major surface side of a solid-state image pickup device 1 shown in FIG. 1, first photoelectric conversion elements (R, G, and B) each for converting an optical signal in a visible light range into an electrical signal, and second photoelectric conversion elements (IR) each for converting an optical signal in an invisible light range into an electrical signal are almost linearly aligned.

In this embodiment, isolation structures 22 and 23 between each two adjacent first photoelectric conversion elements are designed to be different from an isolation structure 21 between the first and second photoelectric conversion elements, and the arrangement of these elements is not limited to that shown in FIG. 1.

As the structure of isolation means used in the present invention, a structure such as 1) a semiconductor layer having the same conductivity type as that of a semiconductor layer to be isolated, and having a high impurity concentration, 2) a semiconductor region having a conductivity type opposite to that of a semiconductor layer to be isolated, 3) isolation using a dielectric, or 4) isolation using a trench groove is used.

More preferably, the visible light elements are isolated using the structure 1), and the visible light and invisible light elements are isolated using the structure 2), 3), or 4).

As the photoelectric conversion element of the present invention, a photovoltaic effect element or a photoconductive element such as a photodiode, a phototransistor, or the like is preferably used.

As the photoelectric conversion element for converting an optical signal in the visible light range into an electrical signal, an element consisting of a material which can selectively absorb only an optical signal in the visible light range, or an element comprising a filter for transmitting light in the visible light range, and shielding light in a wavelength range, used in photoelectric conversion of other photoelectric conversion element, of the invisible light range, is used.

More specifically, in order to obtain a black-and-white signal, the material of the element is selected to have selective sensitivity to a wavelength range from 400 nm to 700 nm as the visible light range, or the element comprises a filter for selectively transmitting light in the wavelength range. Also, in order to obtain an optical signal in a specific range of the visible light range, the element consists of a material having selective sensitivity to the specific range, or the element comprises a filter for selectively transmitting the light in the specific range.

In order to obtain color signals, e.g., red (R), green (G), and blue (B) signals, a plurality of different elements including an element (R element) having selective sensitivity to an R range (e.g., a wavelength range from 580 nm to 700 nm), an element (G element) having selective sensitivity to a G range (e.g., a wavelength range from 480 nm to 580 nm), and an element (B element) having selective sensitivity to a B range (e.g., a wavelength range from 400 nm to 480 nm), are used.

Of course, in this case, each of the R, G, and B elements may consist of a material for selectively absorbing light in the R, G, or B range, i.e., having selective sensitivity to the corresponding range, or an element has sensitivity to all the R, G, and B ranges may comprise filters for selectively transmitting corresponding light components in the R, G, and B ranges.

Figure 2:
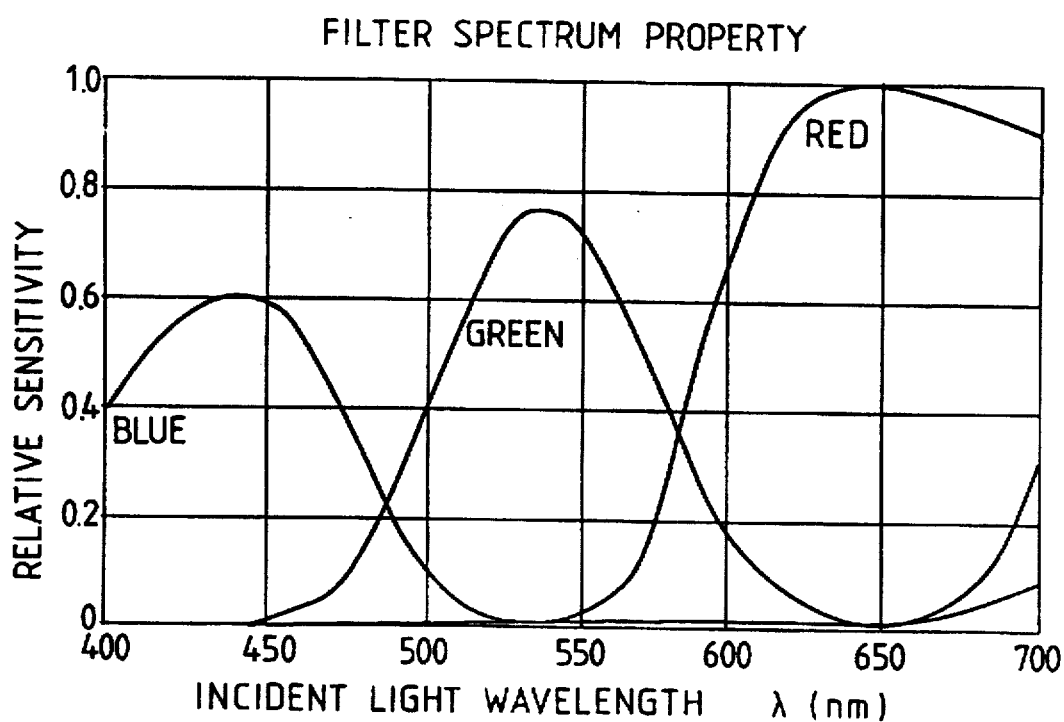
FIG. 2 is a graph showing the spectrum properties of color filters used in the present invention.

FIG. 2 is a graph showing the spectrum properties of typical transmitted light components of filters. The relative sensitivity plotted along the ordinate corresponds to the transmittance with respect to visible light. When selective sensitivity is provided to each element by selecting an appropriate material, for example, each element is formed using a material having a light absorption property corresponding to the relative sensitivity shown in FIG. 2.

The visible light range and the invisible light range, and the R, G, and B wavelength ranges in the present invention are not clearly distinguished from each other by wavelength values, and the photoelectric conversion elements used in the present invention need only be designed to photoelectrically convert ultraviolet, blue, green, red, and infrared light components in required amounts so as to obtain required signals, and not to photoelectrically convert unnecessary light in practice.

On the other hand, as the photoelectric conversion element for converting an optical signal in an invisible light range into an electrical signal, for example, an element having selective sensitivity to ultraviolet rays or infrared rays is used. In this case as well, it is preferable to form the element using a material having selective sensitivity to light in a selected invisible light range, or to combine a material having sensitivity to a wide wavelength range including the invisible light range with a filter having selective transmittance with respect to light in the invisible light range.

Figure 3:
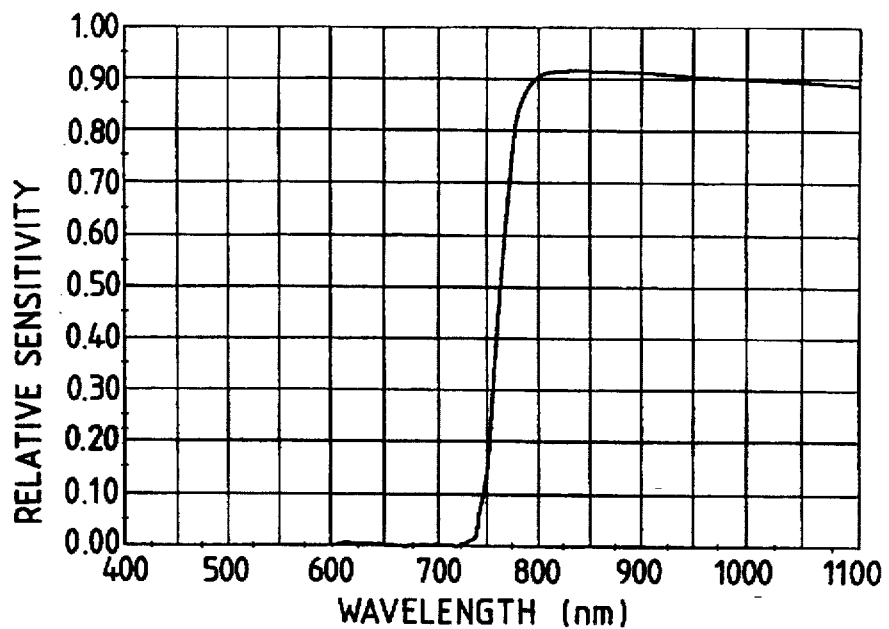
FIG. 3 is a graph showing the spectrum property of a visible light cut filter used in the present invention.

For example, FIG. 3 is a graph showing the spectrum property of typical transmitted light of the filter. The relative sensitivity plotted along the ordinate corresponds to the transmittance with respect to invisible light. FIG. 3 exemplifies a filter having selective sensitivity to an infrared range (e.g., a wavelength range having a lower limit equal to or higher than 750 nm). However, the present invention is not limited to this.

Figure 4:
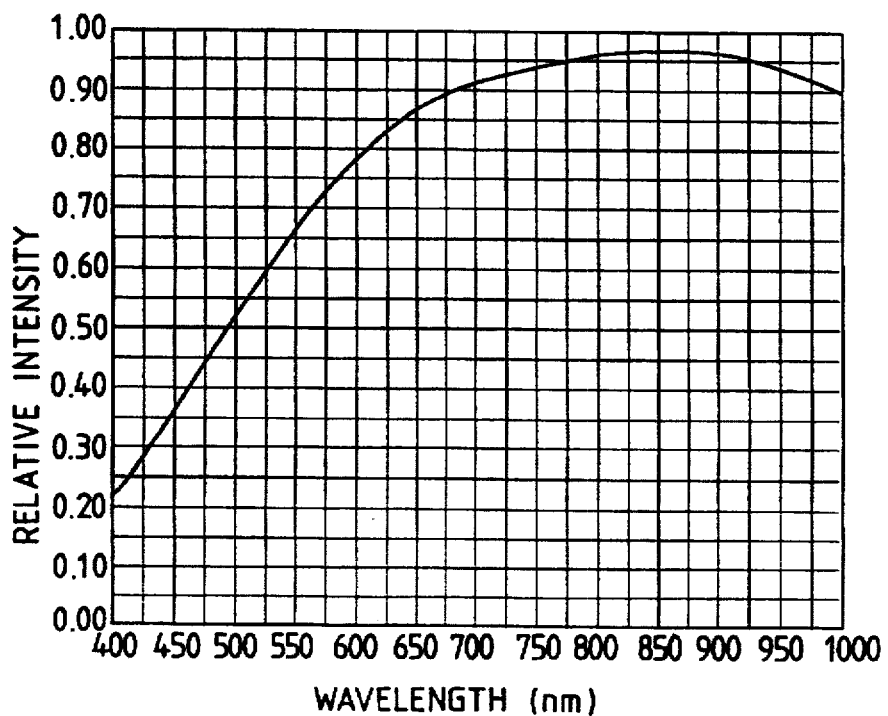
FIG. 4 is a graph showing the light-emission property of a light source used in the present invention.

The solid-state image pickup device of the present invention can constitute a color line sensor by periodically aligning R, G, B, and IR elements in line, as shown in FIG. 1. Preferably, a unit pixel at a resolution of a color signal is designed to include an element (R element) having selective sensitivity to the R range, an element (G element) having selective sensitivity to the G range, an element (B element) having selective sensitivity to the B range, and an element (IR element) having selective sensitivity to the invisible light range. An image which generates an optical signal to be detected includes a three-dimensional image or a two-dimensional image. A typical two-dimensional image is a planar image such as an original. Therefore, when the solid-state image pickup device is used in a system for reading an original image, it is preferable to arrange illumination means for illuminating an original surface. The illumination means includes a light-emitting diode, or a light source such as a xenon lamp, a halogen lamp, or the like. FIG. 4 shows the typical light-emission distribution property of the light source. The light source need only generate light in a required wavelength range in accordance with an optical signal to be detected, and the present invention is not limited to the one having the property shown in FIG. 4. When the light source for generating light having at least the property shown in FIG. 4 is used, R, G, and B light components, and infrared light as an invisible light range can be obtained.

Figure 5:
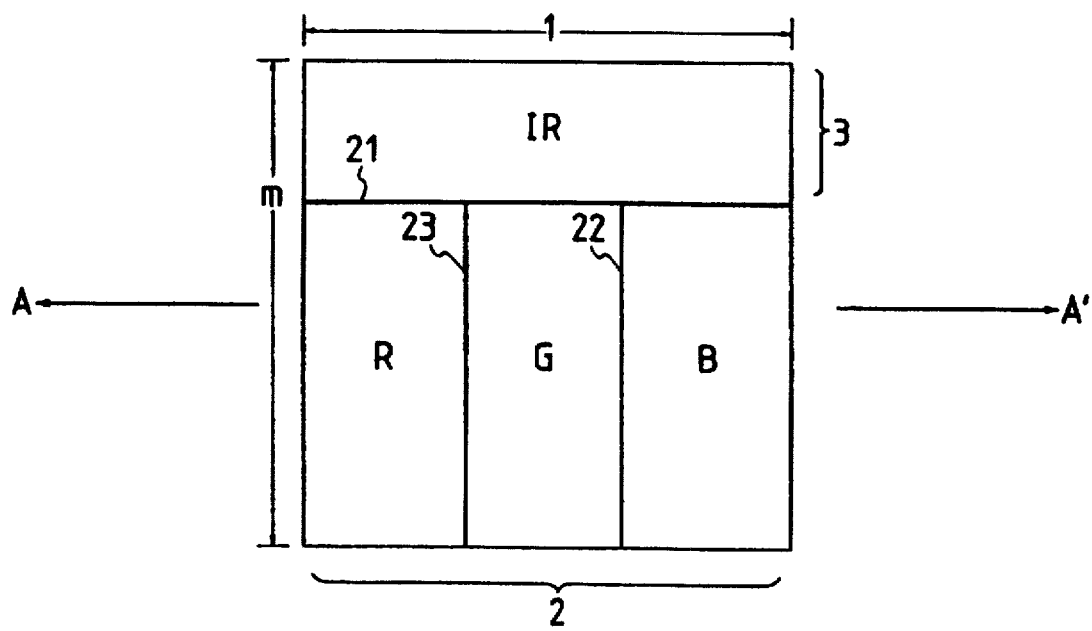
FIG. 5 is a plan view of a solid-state image pickup device according to another aspect of the present invention.

FIG. 5 is a plan view showing the arrangement of photoelectric conversion elements, which is different from that shown in FIG. 1. Referring to FIG. 5, photoelectric conversion element group 2 for converting an optical signal in a visible light range into a first electrical signal including a plurality of color separation signals, and a photoelectric conversion element 3 for converting an optical signal in an invisible light range into a second electrical signal are arranged in a plurality of parallel arrays extending in an AA' direction.

More specifically, the first array generates a plurality of color separation signals in the visible light range, and the second array generates a signal in the invisible light range. Therefore, in FIG. 5, the second array consists of only the photoelectric conversion element for generating a signal in the invisible light range. However, one element (R, G, or B) constituting the first array may be arranged as the second array. In this case, an element isolation structure 21 is different from element isolation structures 22 and 23.

(Embodiment 1-1)

Figure 6:
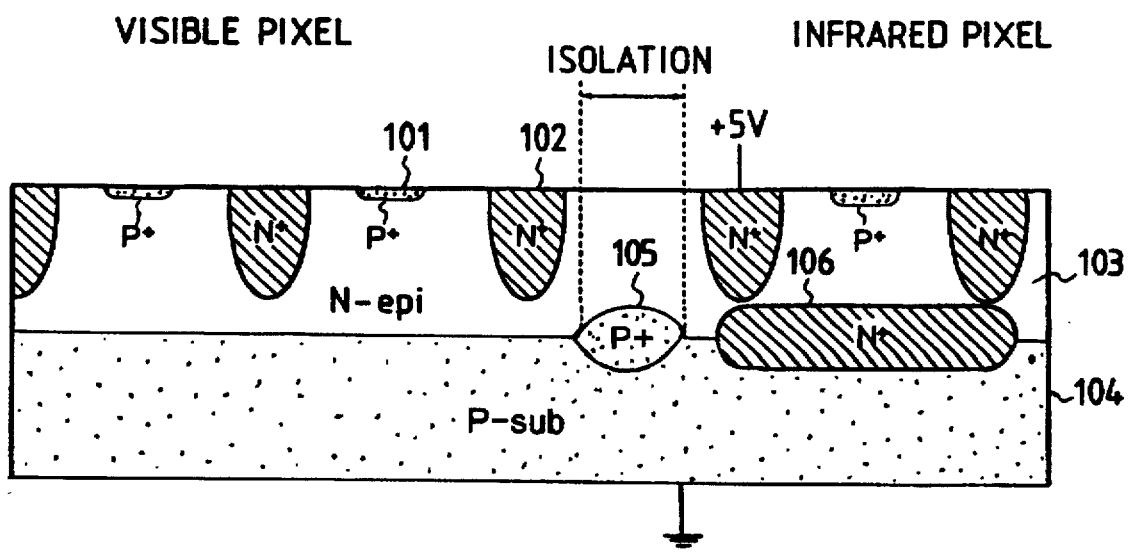
FIG. 6 is a sectional view showing a solid-state image pickup device according to embodiment 1-1 of the present invention.

FIG. 6 shows a solid-state image pickup device according to embodiment 1-1 of the present invention. Referring to FIG. 6, an epitaxial layer 103 has a thickness of about 10 μm, so that high sensitivity is obtained from the visible light range to the infrared range. Visible elements have the same structure. In the structure of an infrared element, a high-concentration buried layer 106 which forms an electric field in the surface direction, and has a conductivity type opposite to that of a substrate, is formed, so that carriers generated in a deep portion from the surface are not discharged to the substrate side, but are concentrated on a photodiode. In FIG. 6, a high-concentration buried layer 105 having the same conductivity type as that of the substrate is formed between the visible and infrared elements. Carriers, which are generated in a deep portion from the surface, and are leaking into the visible element, are absorbed by the high-concentration buried layer when they pass through the buried layer, and are discharged to the substrate side. Thus, leakage to neighboring elements can be prevented.

(Embodiment 1-2)

Figure 7:
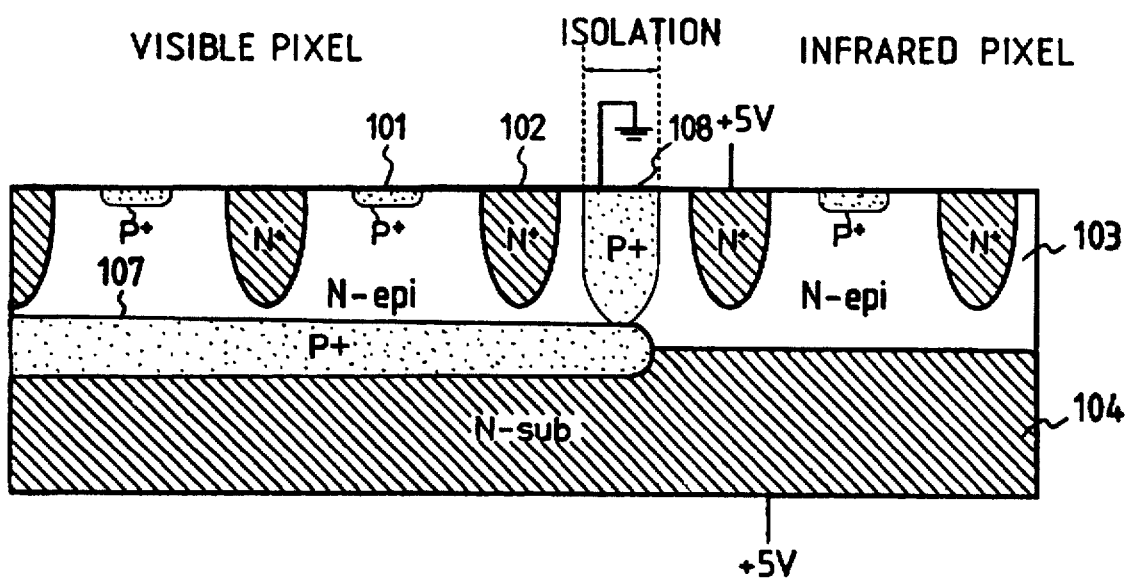
FIG. 7 is a sectional view showing a solid-state image pickup device according to embodiment 1-2 of the present invention.

FIG. 7 shows a solid-state image pickup device according to embodiment 1-2 of the present invention. Referring to FIG. 7, an epitaxial layer 103 has a thickness of about 10 μm, so that high sensitivity is obtained from the visible light range to the infrared range. In this embodiment, a substrate has the same conductivity type as that of the epitaxial layer. The structure of a visible element will be described below. When the epitaxial layer has the same conductivity type as that of the substrate, since an electric field from the epitaxial layer side in the direction of the substrate is not formed, a high-concentration buried layer 107 and a diffusion layer 108, extending from the surface, for supplying a potential to the buried layer are formed so as to prevent leakage of carriers generated in a deep portion from the surface to neighboring elements. With this structure, the visible element has characteristics equivalent to those of embodiment 1-1. On the other hand, in the structure of an infrared element, since carriers generated in a deep portion from the surface are concentrated in the surface direction by an electric field from the substrate side in the direction of the epitaxial layer, high infrared sensitivity can be realized.

The diffusion layer 108 is formed between the visible and infrared elements, and can prevent leakage of carriers therebetween.

(Embodiment 1-3)

Figure 8:
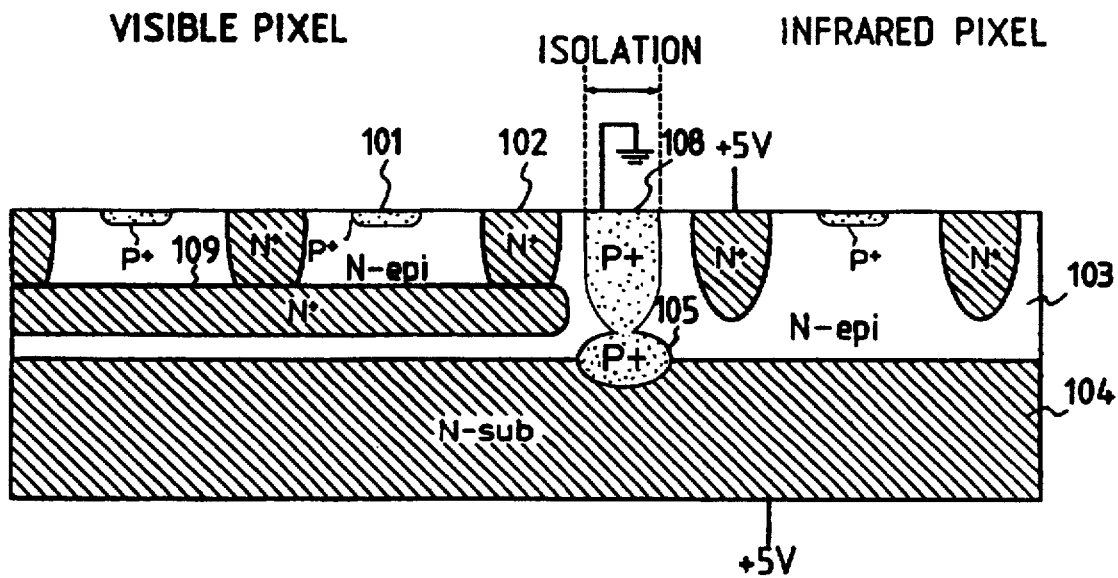
FIG. 8 is a sectional view showing a solid-state image pickup device according to embodiment 1-3 of the present invention.

FIG. 8 shows a solid-state image pickup device according to embodiment 1-3 of the present invention. In this embodiment, the structure of a visible element is different from that of embodiment 1-2. In place of the high-concentration buried layer having a conductivity type opposite to that of a substrate, a high-concentration layer 109 having the same conductivity type as that of the substrate is formed by ion implantation from the surface. In this structure, movement of carriers generated in a deep portion of the visible element in the direction of a photodiode on the surface is blocked by a potential barrier of the high-concentration layer 109. As for isolation between the visible and infrared elements, an effect equivalent to that of embodiment 1-2 is obtained by forming a concentration buried layer 105 and a diffusion layer 108 which have a conductivity type opposite to that of the substrate.

(Embodiment 1-4)

Figure 9:
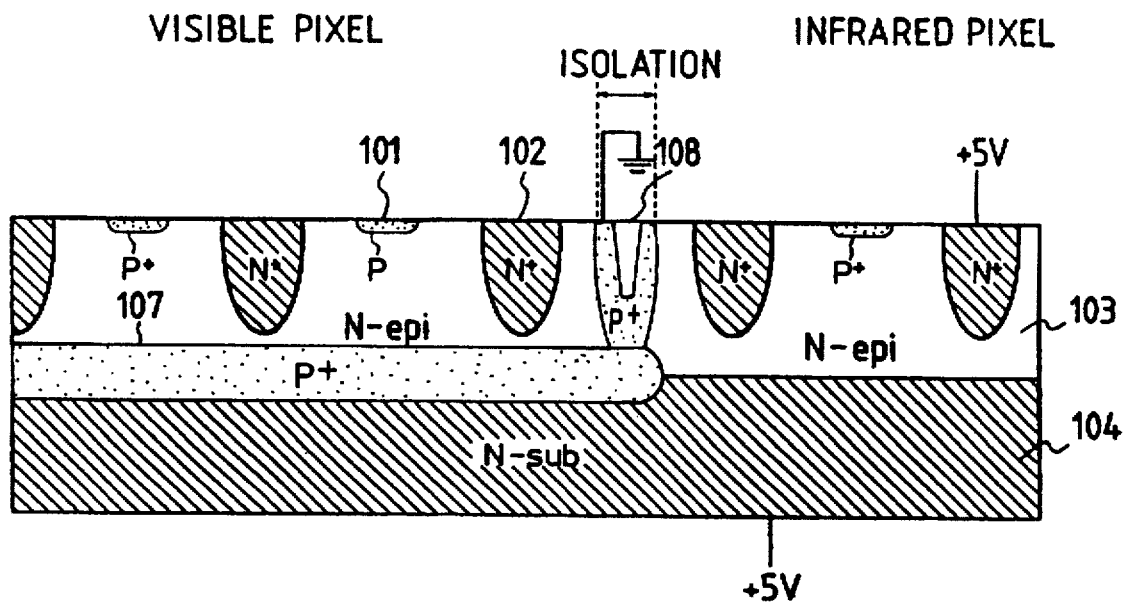
FIG. 9 is a sectional view showing a solid-state image pickup device according to embodiment 1-4 of the present invention.

FIG. 9 shows a solid-state image pickup device according to embodiment 1-4 of the present invention. In order to form a deep high-concentration diffusion layer from the surface, this embodiment exemplifies a structure wherein a groove is formed from the surface, and thereafter, the diffusion layer is formed. With this structure, the isolation interval between visible and infrared elements can be remarkably decreased. The diffusion layer with the above structure can be applied to all other embodiments.

(Embodiment 1-5)

Figure 10:
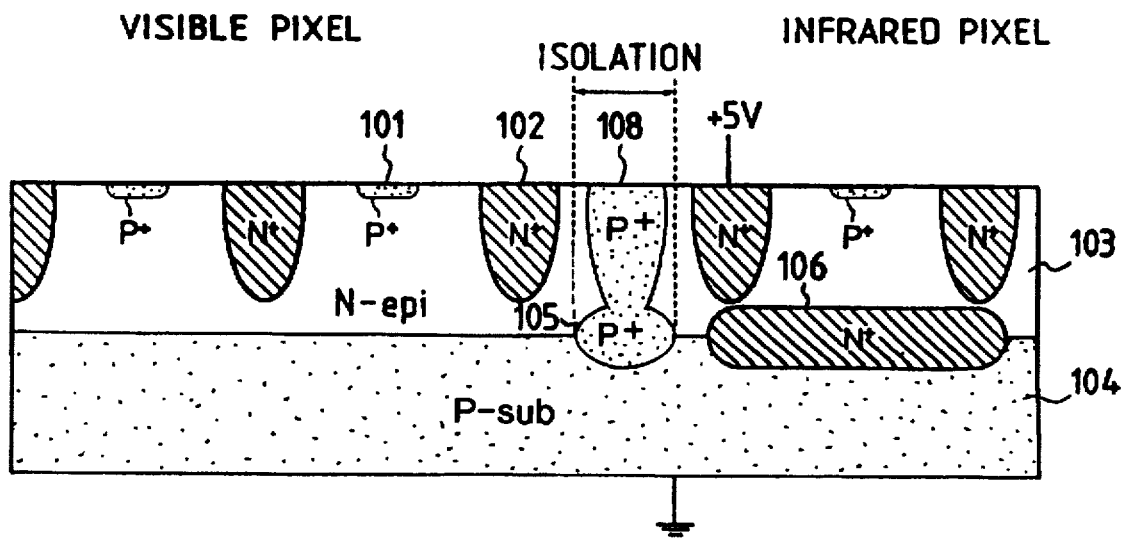
FIG. 10 is a sectional view showing a solid-state image pickup device according to embodiment 1-5 of the present invention.

FIG. 10 shows a solid-state image pickup device according to embodiment 1-5 of the present invention. As compared to embodiment 1-1, a diffusion layer 108 for isolation is formed between visible and infrared elements.

(Embodiment 1-6)

Figure 11:
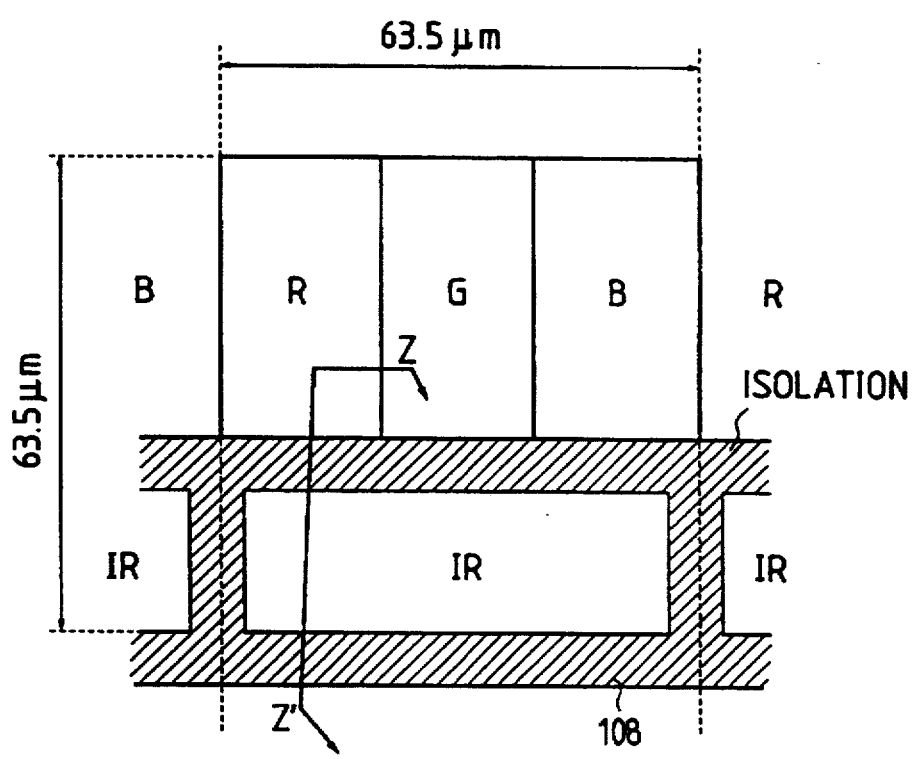
FIG. 11 is a plan view showing a solid-state image pickup device according to embodiment 1-6 of the present invention.
Figure 12:
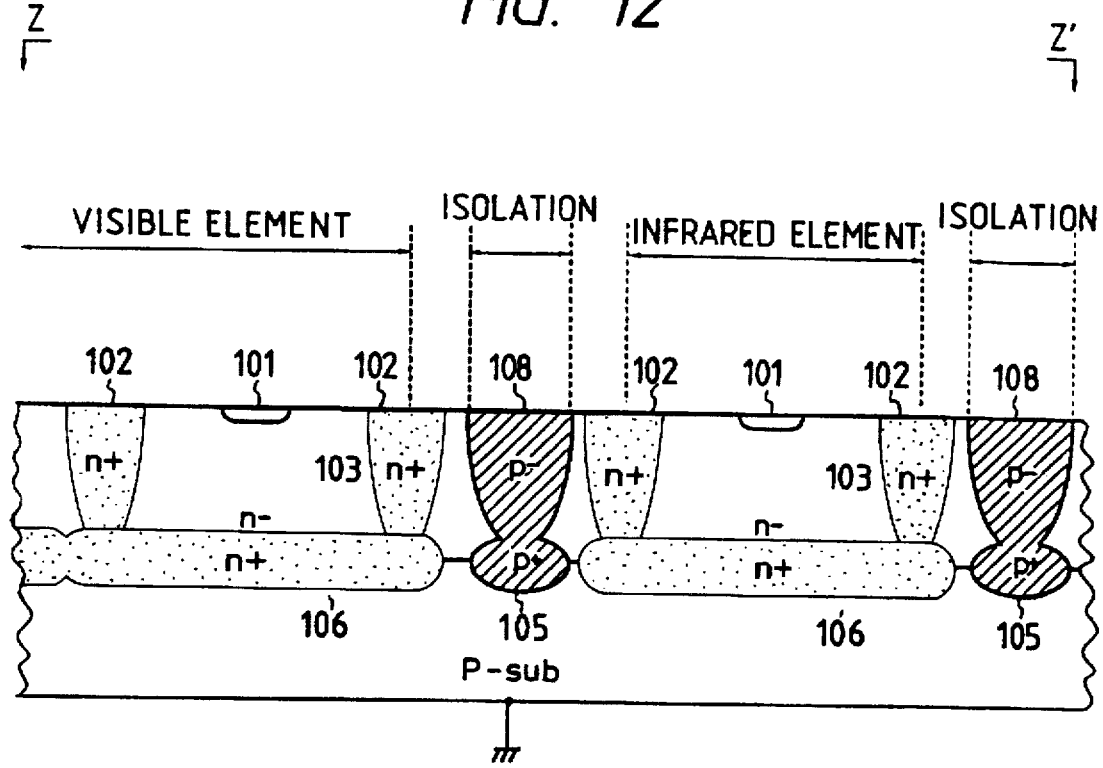
FIG. 12 is a sectional view showing the solid-state image pickup device according to embodiment 1-6 of the present invention.

FIG. 11 is a plan view showing a solid-state image pickup device according to embodiment 1-6 of the present invention, and FIG. 12 is a sectional view taken along a line ZZ' in FIG. 11.

FIG. 11 shows filters R, G, B, and IR, but FIG. 12 does not illustrate them.

In this embodiment, isolation between two adjacent visible elements is attained by an $n^+$ region 102, and isolation between the visible element and an infrared element is attained by a $p^-$ region 108 and a $p^+$ region 105.

(Embodiment 1-7)

Figure 13:
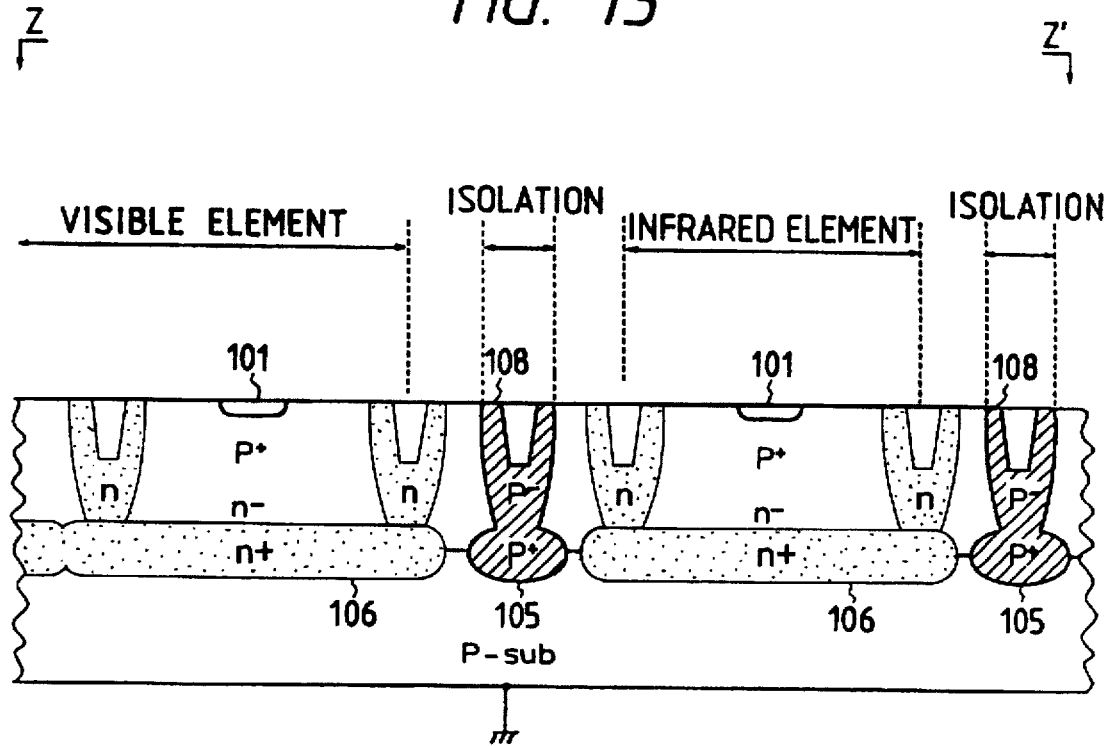
FIG. 13 is a sectional view showing a solid-state image pickup device according to embodiment 1-7 of the present invention.

FIG. 13 is a sectional view of a solid-state image pickup device according to this embodiment, and this embodiment has substantially the same structure as that of embodiment 1-6, except for its sectional structure.

In this embodiment, since a trench groove is formed in a prospective element isolation region, and thereafter, an isolation region is formed by impurity diffusion, a narrow, deep isolation region can be obtained.

(Embodiment 1-8)

Figure 14:
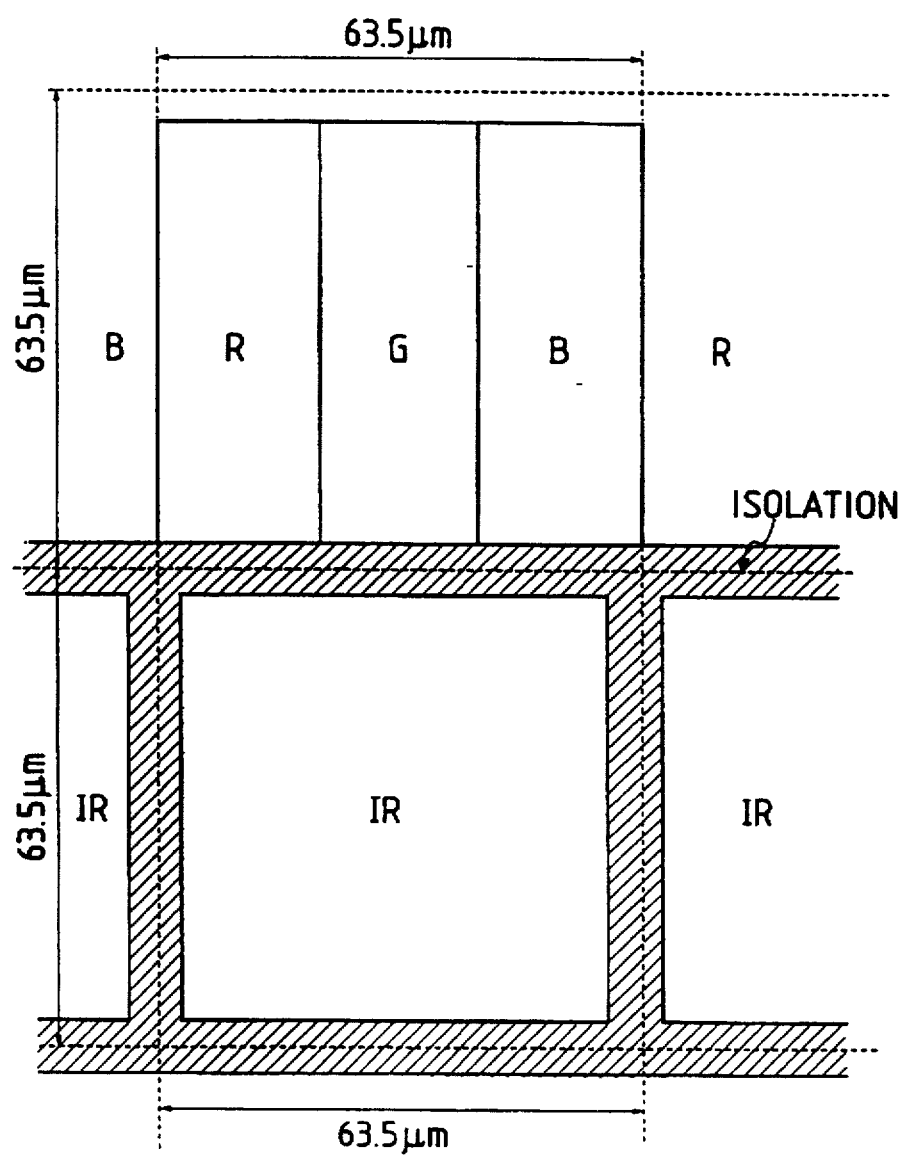
FIG. 14 is a plan view showing a solid-state image pickup device according to embodiment 1-8 of the present invention.

FIG. 14 is a plan view of a solid-state image pickup device according to this embodiment. In this embodiment, the effective area of an IR element in embodiment 1-6 is increased.

Therefore, this embodiment is effective when sensitivity to invisible light is to be improved. When a visible light element and an invisible light element are set to have equal sub-scanning lengths, signal processing in the sub-scanning direction is facilitated.

(Embodiment 1-9)

Figure 15:
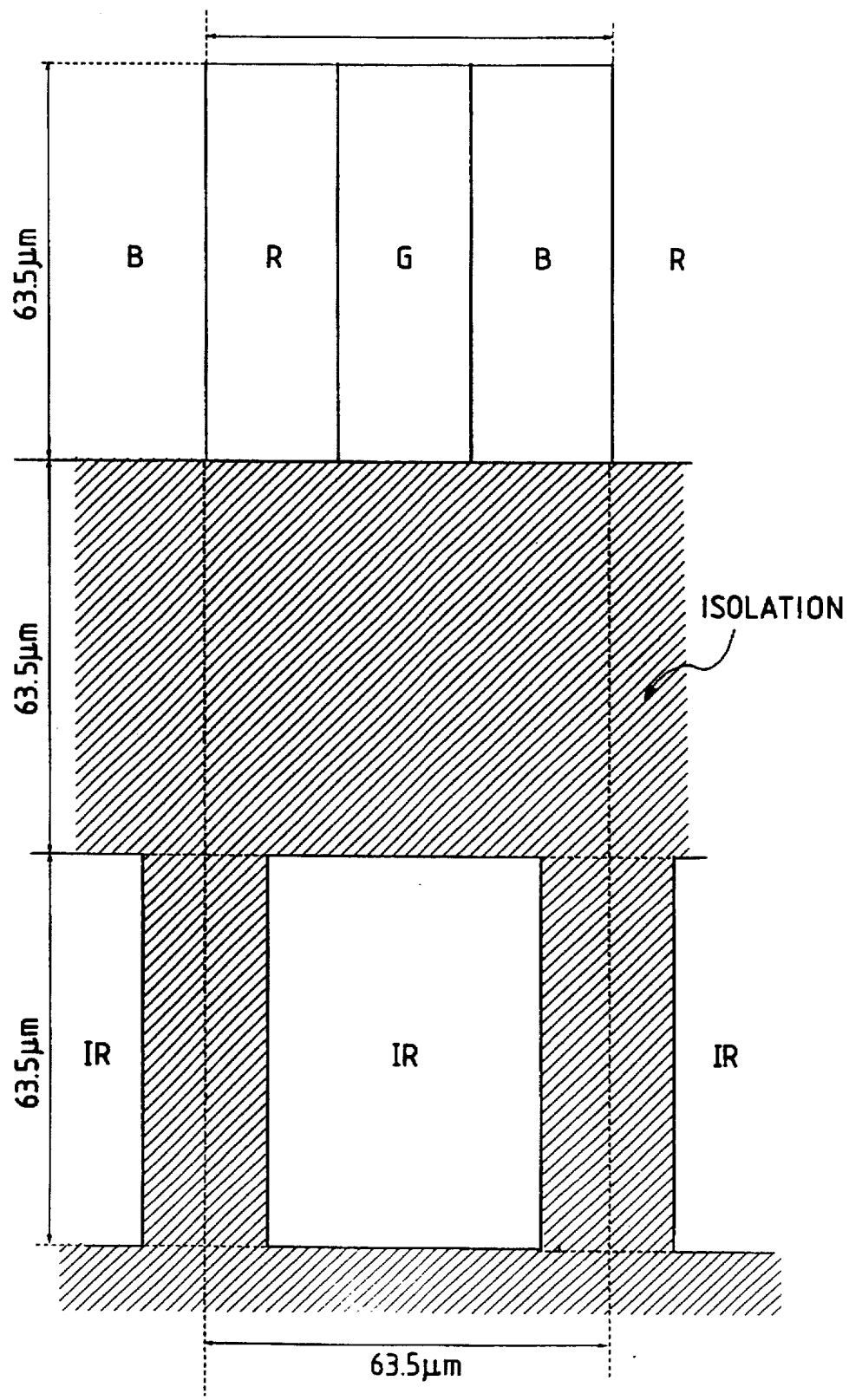
FIG. 15 is a plan view showing a solid-state image pickup device according to embodiment 1-9 of the present invention.

FIG. 15 shows an arrangement wherein a visible light element array including R, G, and B elements, and an infrared element array including IR elements are separately arranged in two lines, and the R, G, and B elements, and the IR elements are separated by one line. In this embodiment, high sensitivity to both visible light and infrared rays can be realized, and isolation between the visible and infrared elements can be satisfactory.

(Embodiment 1-10)

Figure 16:
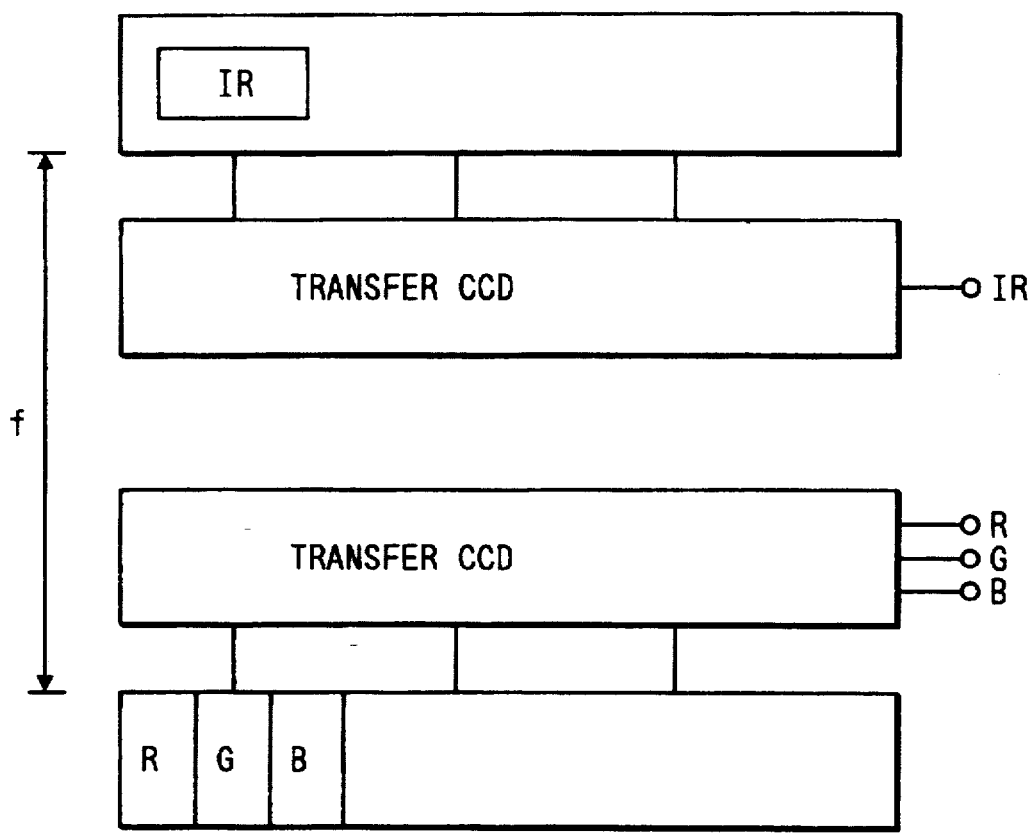
FIG. 16 is a plan view showing a solid-state image pickup device according to embodiment 1-10 of the present invention.

FIG. 16 is a plan view showing a solid-state image pickup element according to embodiment 1-10 of the present invention.

In this embodiment, two adjacent visible light elements are isolated by the same isolation region as the isolation region 102 in FIG. 12, while a sufficiently large distance f is assured between the visible light element and an invisible light element, thus attaining practical element isolation.

(Scanning Circuit)

Each of the solid-state image pickup devices of embodiments 1-1 to 1-9 described above is preferably constituted as an integrated circuit in which a scanning circuit as a read circuit is integrally formed on a single substrate together with pixel arrays including photoelectric conversion elements. As the scanning circuit, one of or a proper combination of a CCD type shift register, a CCD type transfer gate, a shift register using transistors, and a transfer gate using transistors is used. Also, storage capacitors for storing photoelectrically converted electrical signals may be arranged as needed.

Figure 17:
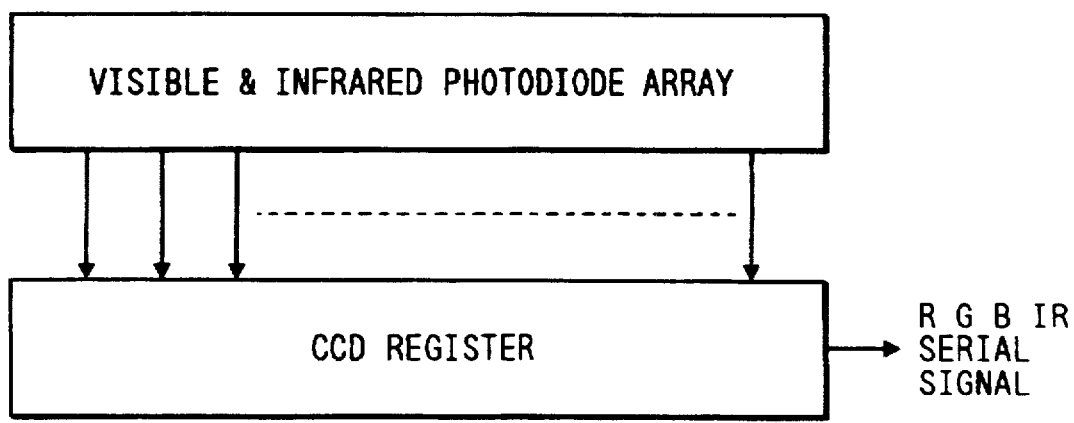
FIG. 17 is a block diagram showing a scanning circuit of a solid-state image pickup device used in the present invention.

In the arrangement shown in FIG. 17, after signals from the photodiode arrays shown in FIG. 1 are transferred to a CCD register; signals are serially read out in the order of, e.g., R, G, B, and IR.

Figure 18:
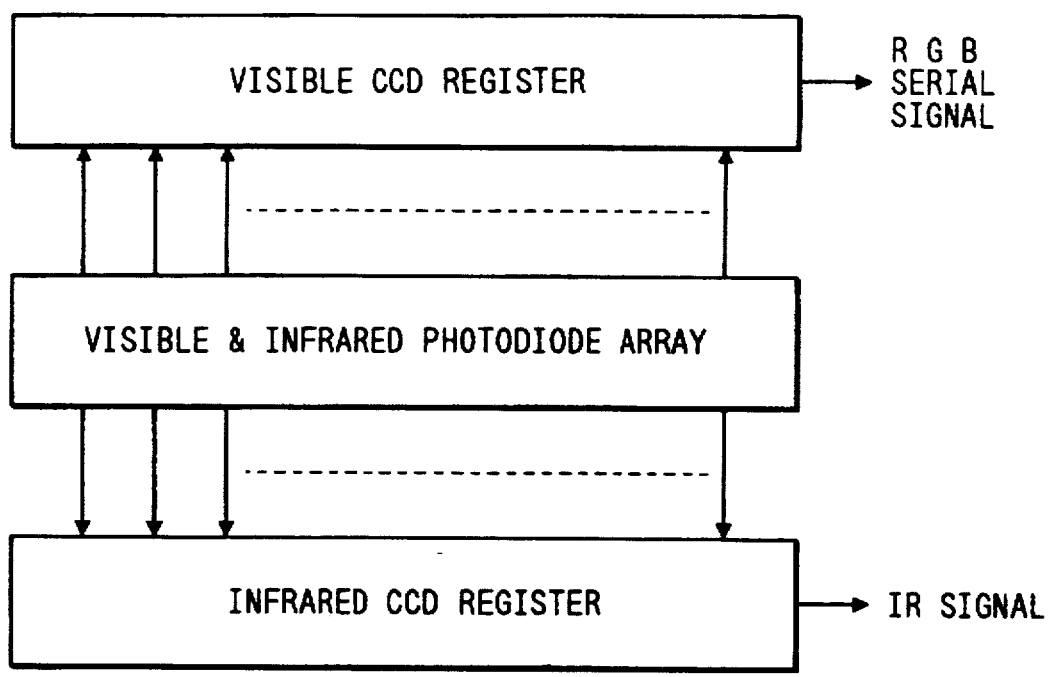
FIG. 18 is a block diagram showing another scanning circuit of a solid-state image pickup device used in the present invention.

FIG. 18 shows an arrangement suitably used in the structure shown in FIG. 5. Of signals from the photodiode arrays, R, G, and B signals are transferred to a visible CCD register, and an IR signal is transferred to an infrared CCD register on the side opposite to the visible CCD register. Thereafter, R, G, and B serial outputs and an IR output are independently and parallelly read out.

Figure 19:
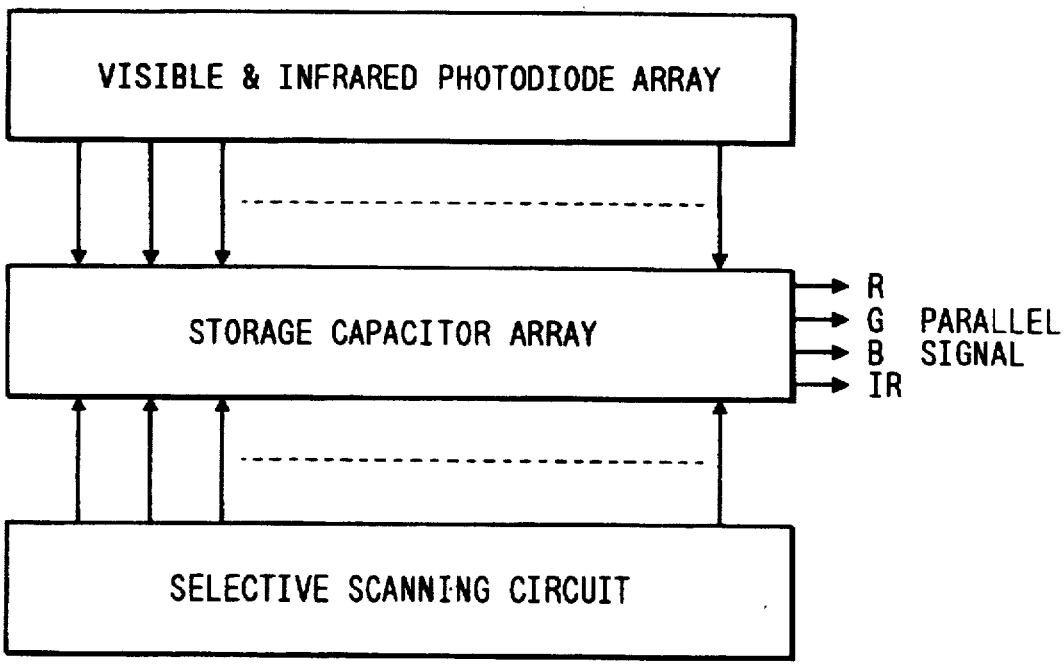
FIG. 19 is block diagram showing still another scanning circuit of a solid-state image pickup device used in the present invention.

FIG. 19 shows still another arrangement. Signals from the photodiode arrays are simultaneously transferred to corresponding storage capacitors and are temporarily stored therein. Thereafter, the stored signals are sequentially read out by a selective scanning circuit. In this case, since the signals can be independently output from the storage capacitors in units of photodiodes, R, G, B, and IR signals can be parallelly read out.

Figure 20:
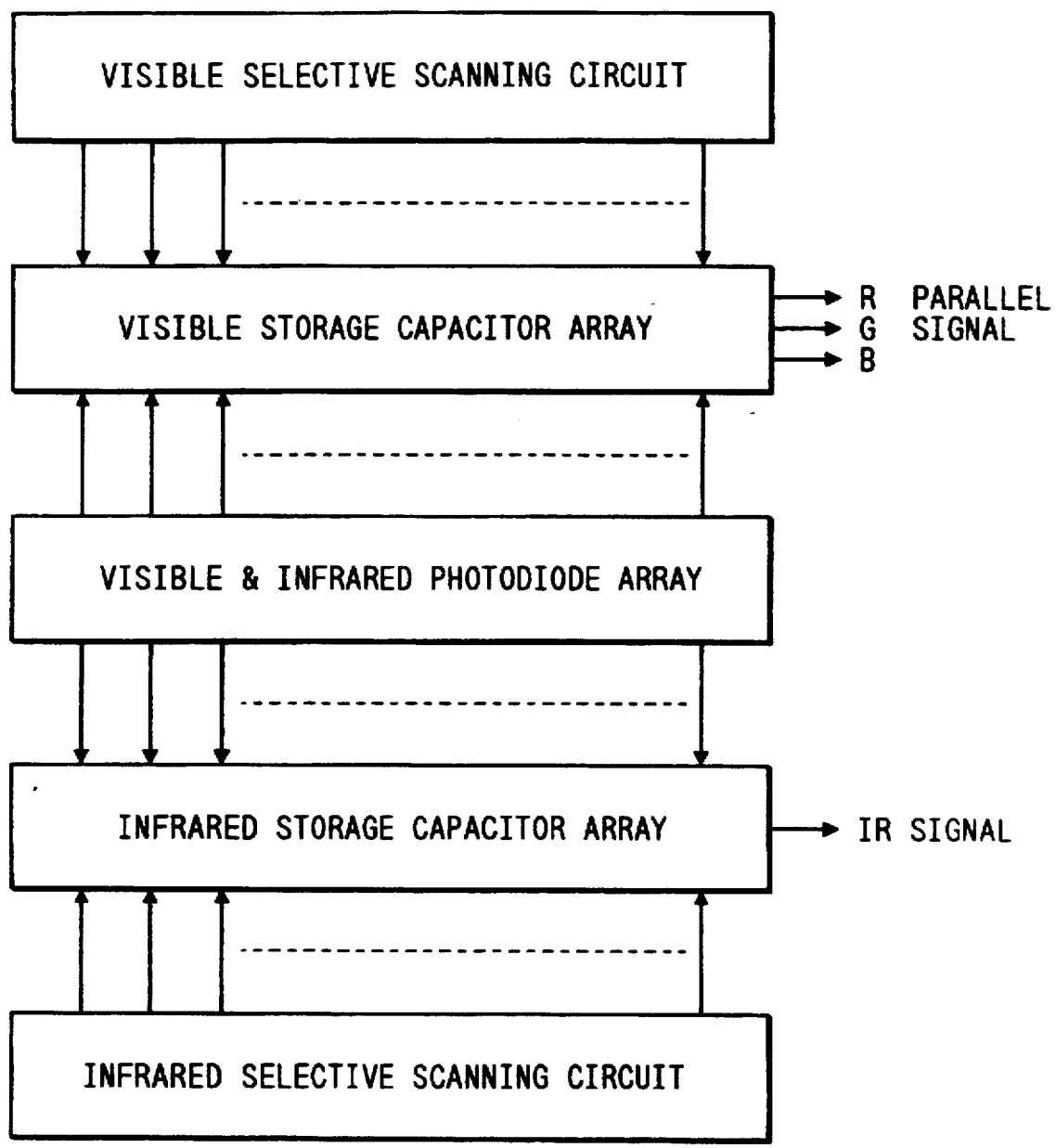
FIG. 20 is block diagram showing still another scanning circuit of a solid-state image pickup device used in the present invention.

FIG. 20 shows still another arrangement. R, G, and B signals of visible light and an IR signal of infrared light are vertically separately read out.

(Image Information Processing Apparatus)

An image information processing apparatus according to the present invention will be described below.

Figure 21:
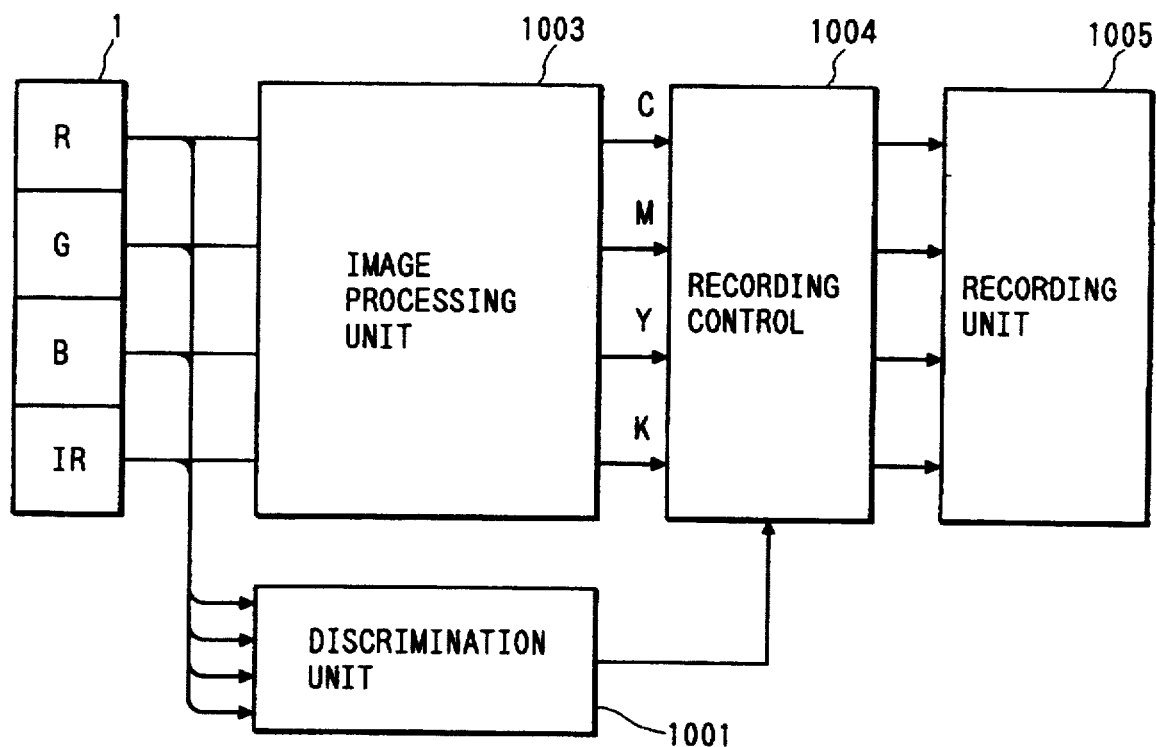
FIG. 21 is a block diagram showing a control system of an image information processing apparatus according to the present invention.

FIG. 21 is a block diagram of the image information processing apparatus. Signals from a solid-state image pickup device (sensor) 1 according to one of the above-mentioned embodiments is input to an image processing unit 1003 and a discriminating unit 1001 as discrimination means. Information output from these units is reproduced and recorded by a recording unit 1005 driven by a recording control unit 1004.

The sensor 1 reads a signal from almost the same point on an original at a pixel density of 400 dpi while separating the signal into R (red), G (green), and B (blue) components, and an infrared component having sensitivity near a wavelength of about 1,000 nm.

The outputs from the sensor are subjected to so-called shading correction using a white plate and an infrared reference plate, and are then input, as 8-bit image signals, to the discriminating unit 1001 and the image processing unit 1003. The image processing unit 1003 performs processing operations such as variable-magnification masking, OCR, and the like, which are performed in a normal color copying machine, and generates four color signals C, M, Y, and K as recording signals.

On the other hand, the discriminating unit 1001 performs detection of a specific pattern in the original as the characteristic feature of the present invention, and outputs the detection result to the recording control unit 1004. Then, the recording signals are subjected to processing such as painting in a specific color, as needed, and the processed recording signals are recorded on a recording sheet by the recording unit 1005, or the recording operation is stopped, thereby inhibiting faithful image reproduction of a copy-inhibited original.

An image pattern to be detected in the present invention will be briefly described below with reference to FIGS. 22 and 23.

Figure 22:
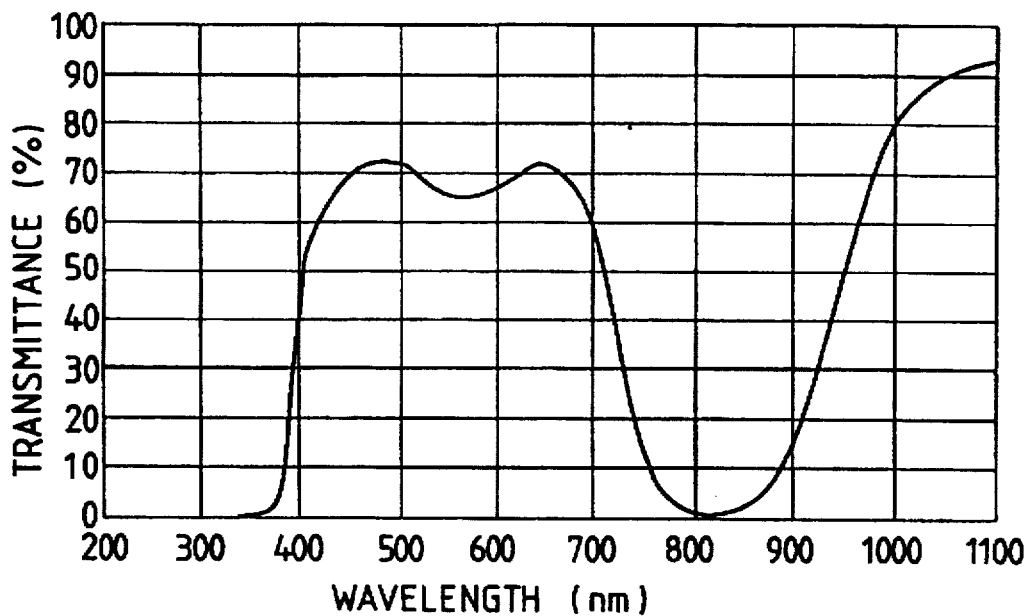
FIG. 22 is a graph showing the spectrum property of an infrared light absorbing dyestuff used for an original, which can be read by the image information processing apparatus of the present invention.

FIG. 22 shows the spectrum property of a transparent dyestuff which is almost transparent in the visible range, and absorbs infrared rays near 800 nm. For example, SIR-159 (available from Mitsui Toatsu Chemicals, Inc.) is popularly used.

Figure 23:
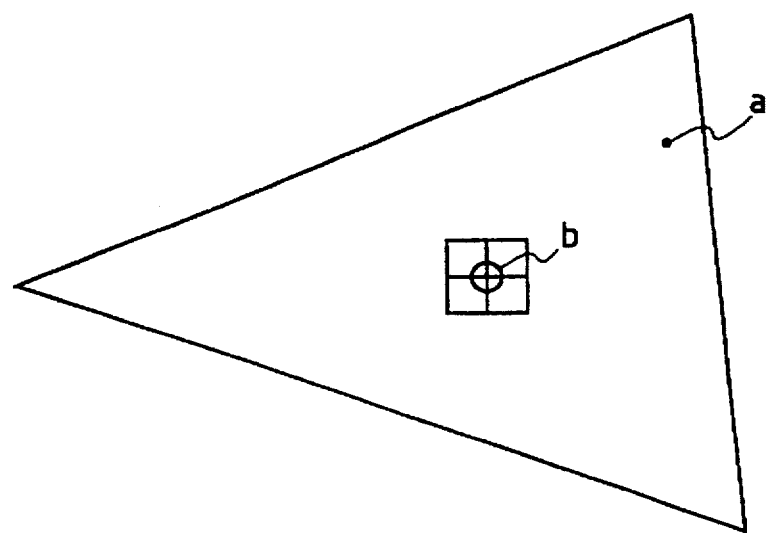
FIG. 23 is a view showing an original which can be read by the image information processing apparatus of the present invention.

FIG. 23 shows an example of a pattern formed using a transparent ink consisting of the above-mentioned transparent infrared absorbing dyestuff. More specifically, a small square pattern b each side of which has a length of about 120 μm is printed using the transparent ink on a triangular pattern recorded in an ink a which reflects a specific light component, i.e., infrared rays. As shown in FIG. 23, since these patterns have almost the same color in the visible light range, the pattern b cannot be identified by the eyes of man, but can be detected in the infrared range. For the sake of simplicity for the following description, a 120 μm² pattern is illustrated. When the region of the pattern b is read at 400 dpi, the pattern b corresponds to about four pixels, as shown in FIG. 23. Note that the present invention is not limited to this pattern formation method.

The details of the discriminating unit 1001 shown in FIG. 21 will be described below with reference to FIG. 24.

Figure 24:
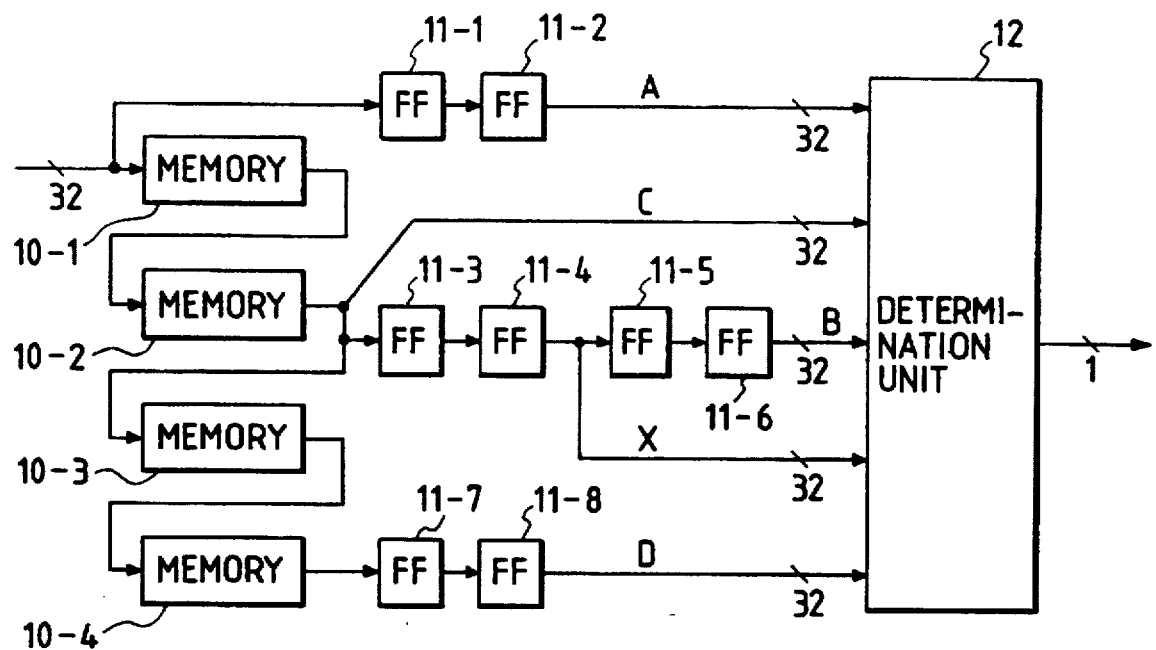
FIG. 24 is a block diagram showing the arrangement of a discrimination means in the image information processing apparatus of the present invention.
Figure 25:
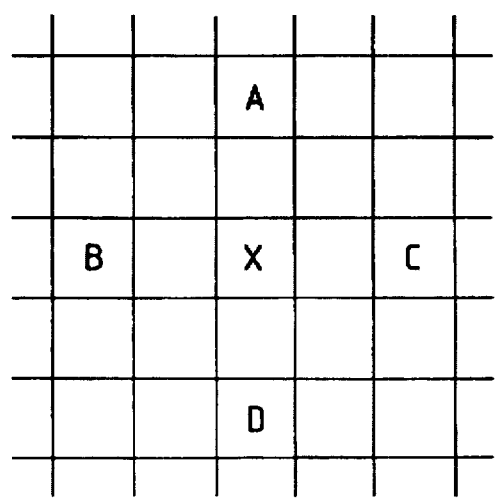
FIG. 25 is a view for explaining a discrimination operation in the image information processing apparatus of the present invention.

Referring to FIG. 24, each of image data delay units 10-1 to 10-4 comprising FiFo memories delays 32-bit (8 bits×four components) image data by one line.

Figure 26:
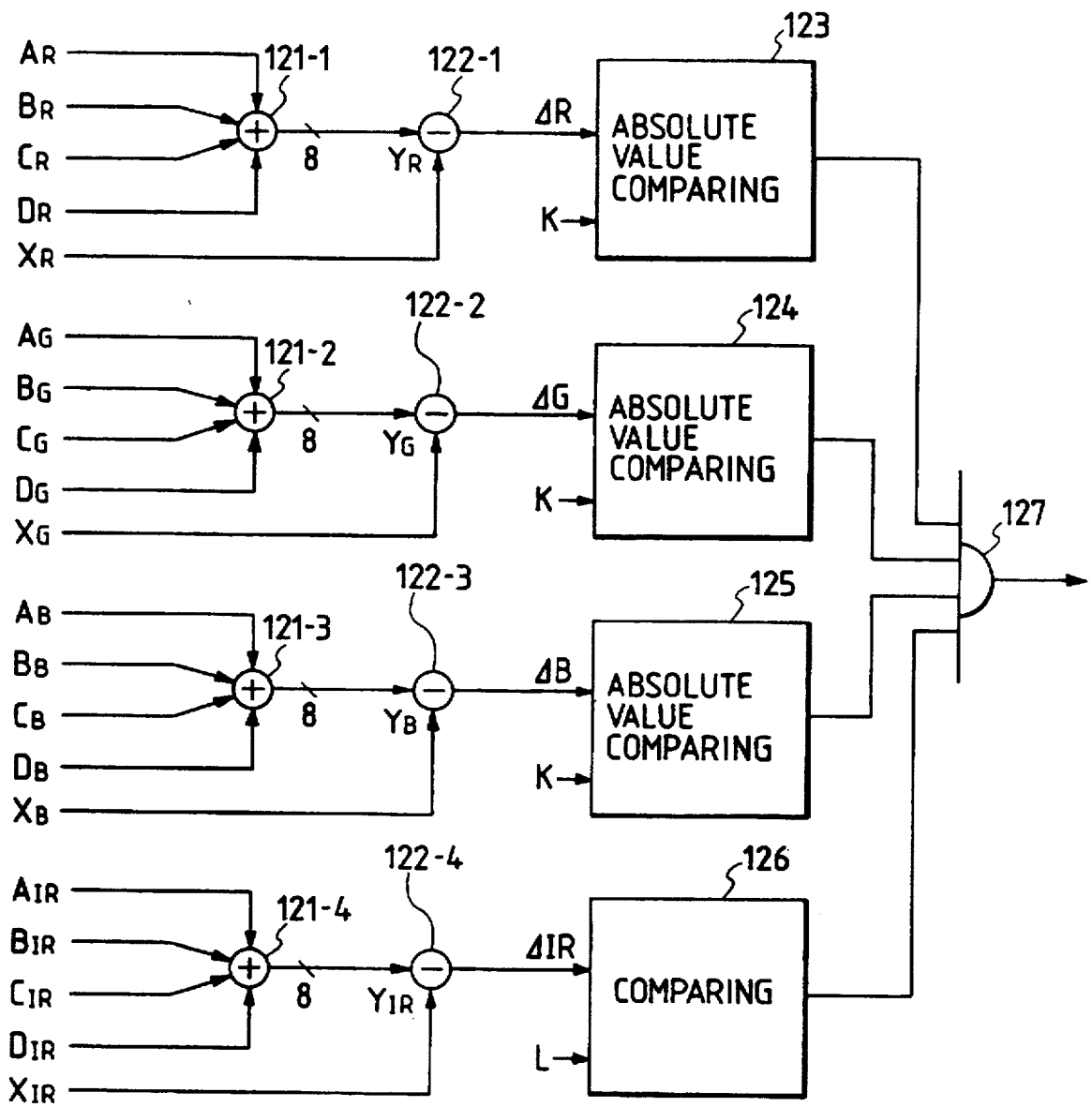
FIG. 26 is a block diagram showing the detailed arrangement of the discrimination means shown in FIG. 24.

Input image signals are delay-held by two pixels by flip-flops (FFs) 11-1 and 11-2 to output pixel data A, are delayed by two lines by the memories 10-1 and 10-2 to output pixel data C, are further delayed by two pixels by FFs 11-3 and 11-4 to output pixel of interest data X, are further delayed by two pixels by FFs 11-5 and 11-6 to output pixel data B, and are further delayed by the memories 10-3 and 10-4 and FFs 11-7 and 11-8 to output pixel data D. These pixel data are simultaneously input to a determination unit 12. The positional relationship between the pixel X of interest and the four pixels A, B, C, and D near the pixel X is as shown in FIG. 26.

Assuming that the pixel X of interest is reading an ink of a portion of the pattern b in FIG. 23, the pixels A, B, C, and D are reading an image of the pattern a located around the pattern b.

(Discrimination Algorithm)

Assume that R, G, B, and infrared components constituting the pixel signal A are respectively represented by $A_R$, $A_G$, $A_B$, and $A_{IR}$, and the R, G, B, and infrared components constituting each of the pixel signals B, C, and D are similarly defined. Average values $Y_R$, $Y_G$, $Y_B$, and $Y_{IR}$ of the same color components are calculated by the following equations:

$$Y_R = \tfrac{1}{4}(A_R + B_R + C_R + D_R)$$

$$Y_G = \tfrac{1}{4}(A_G + B_G + C_G + D_G)$$

$$Y_B = \tfrac{1}{4}(A_B + B_B + C_B + D_B)$$

$$Y_{IR} = \tfrac{1}{4}(A_{IR} + B_{IR} + C_{IR} + D_{IR})$$

A target pattern is discriminated according to the differences between the average values Y calculated by the above equations, and the pixel X of interest. That is, when $\Delta R = |Y_R - X_R|$, $\Delta G = |Y_G - X_G|$, $\Delta B = |Y_B - X_B|$, and $\Delta IR = Y_{IR} - X_{IR}$, if $\Delta R < K$, $\Delta G < K$, $\Delta B < K$, and $\Delta IR > L$ (K and L are constants)

are satisfied, then the presence of the pattern is discriminated.

More specifically, it can be determined that the pixel of interest has small color tone differences from its surrounding pixels, and has a different exceeding the constant L in the infrared property from the surrounding pixels.

FIG. 26 shows a hardware arrangement for practicing the above-mentioned discrimination algorithm. Adders 121 simply add color components of four pixels, and output upper 8 bits of the sums, thereby obtaining $Y_R$, $Y_G$, $Y_B$, and $Y_{IR}$. Subtracters 122 respectively calculate differences between $Y_R$, $Y_G$, $Y_B$, and $Y_{IR}$ and the corresponding components of the pixel of interest signal. The absolute values of the calculated differences of the R, G, and B components are compared with the constant K as a reference signal by comparing units 123, 124, and 125. On the other hand, the calculated difference of the infrared component is compared with the constant L as a reference signal by a comparing unit 126. The outputs from these comparing units are input to an AND gate 127, and when "1" appears at the output terminal of the AND gate 127, it is determined that the pattern is discriminated.

Figure 27:
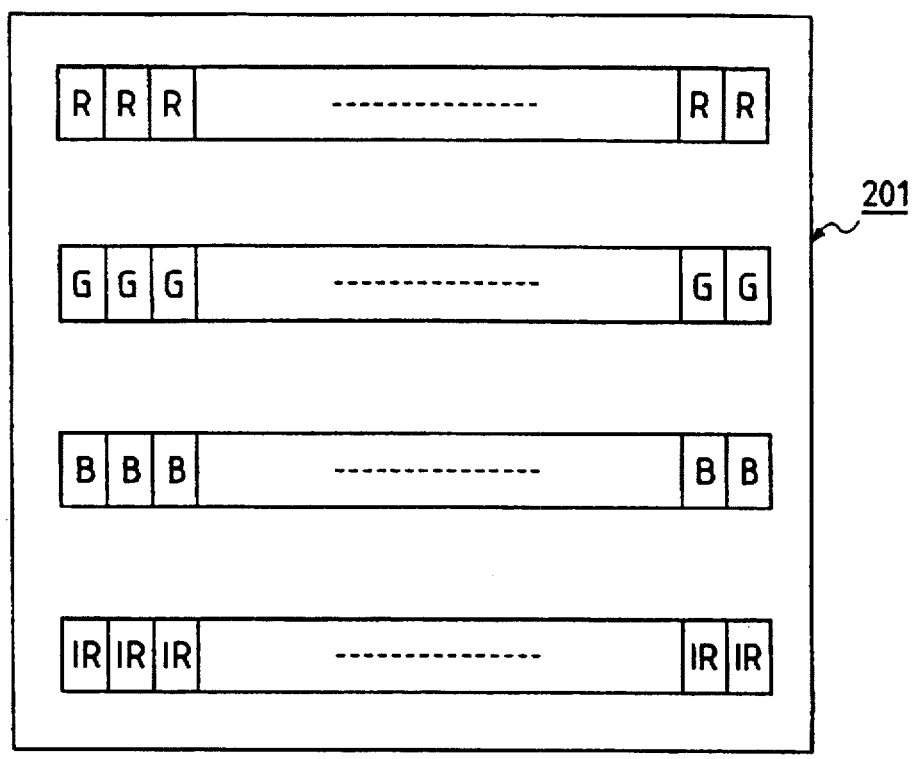
FIG. 27 is a plan view of a solid-state image pickup device according to still another aspect of the present invention.

FIG. 27 is a plan view for explaining another aspect of the present invention. In an image sensor 1, photoelectric conversion elements (R, G, and B) each for converting an optical signal in a visible light range into an electrical signal, and photoelectric conversion elements (IR) each for converting an optical signal in an invisible light range into an electrical signal are aligned in four lines. Therefore, a high-performance image sensor, which can detect optical signals over a wide range including an invisible light range and a visible light range, can be provided.

As the photoelectric conversion element of the present invention, a photovoltaic effect element or a photoconductive element such as a photodiode, a phototransistor, or the like is preferably used.

As the photoelectric conversion element for converting an optical signal in the visible light range into an electrical signal, an element which comprises a multi-layered filter for transmitting light in the visible light range to be able to selectively absorb only an optical signal in the visible light range, and shielding light in a wavelength range, used in photoelectric conversion of other photoelectric conversion element, of the invisible light range, is used.

In order to obtain an optical signal in a specific range of the visible light range, the element comprises a multi-layered filter, consisting of a material having selectively sensitivity to the specific range, for selectively transmitting light in the specific range.

In order to obtain color signals, e.g., red (R), green (G), and blue (B) signals, a plurality of different multi-layered filters for an element (R element) having selective sensitivity to an R range (e.g., a wavelength range from 580 nm to 700 nm), an element (G element) having selective sensitivity to a G range (e.g., a wavelength range from 480 nm to 580 nm), and an element (B element) having selective sensitivity to a B range (e.g., a wavelength range from 400 nm to 480 nm) are used.

Of course, in this case, the multi-layered filters are constituted by stacking filters for selectively transmitting light components in the R, G, and B ranges on a filter consisting of a material which has sensitivity to all the R, G, and B ranges except for the invisible light range so as to selectively absorb light components in the R, G, and B ranges.

In this case, it is preferable that a filter for shielding light in the invisible light range be commonly used in the multi-layered filters of the R, G, and B elements since steps can be eliminated from the structure.

The solid-state image pickup device of the present invention can constitute a color line sensor by aligning the R, G, B, and IR elements in four lines, as shown in FIG. 27. Preferably, a unit pixel at a resolution of a color signal is designed to include an element (R element) including a multi-layered filter having selective sensitivity to the R range, an element (G element) including a multi-layered filter having selective sensitivity to the G range, an element (B element) including a multi-layered filter having selective sensitivity to the B range, and an element (IR element) including a multi-layered filter having selective sensitivity to a selected invisible light range.

More preferably, each of the filters of the respective elements comprises a multi-layered filter consisting of a plurality of filters having different spectrum properties, and the number of layers of the visible light filter coincides with that of the invisible light filter, thereby reducing steps on the surface.

An image which generates an optical signal to be detected includes a three-dimensional image or a two-dimensional image. A typical two-dimensional image is a planar image such as an original. Therefore, when the image sensor is used in a system for reading an original image, it is preferable to arrange illumination means for illuminating an original surface. The illumination means includes a light-emitting diode, or a light source such as a xenon lamp, a halogen lamp, or the like. FIG. 4 shows the typical light-emission distribution property of the light source. The light source need only generate light in a required wavelength range in accordance with an optical signal to be detected, and the present invention is not limited to one having the property shown in FIG. 4. When the light source for generating light having at least the property shown in FIG. 4 is used, R, G, and B light components, and infrared light as an invisible light range can be obtained.

The embodiments of the present invention will be described in detail hereinafter. However, the present invention is not limited to these embodiments, and changes such as substitutions of constituting elements selection of materials, and the like may be made within the scope of the invention as long as the object of the present invention is achieved.

(Embodiment 2-1)

Figure 28:
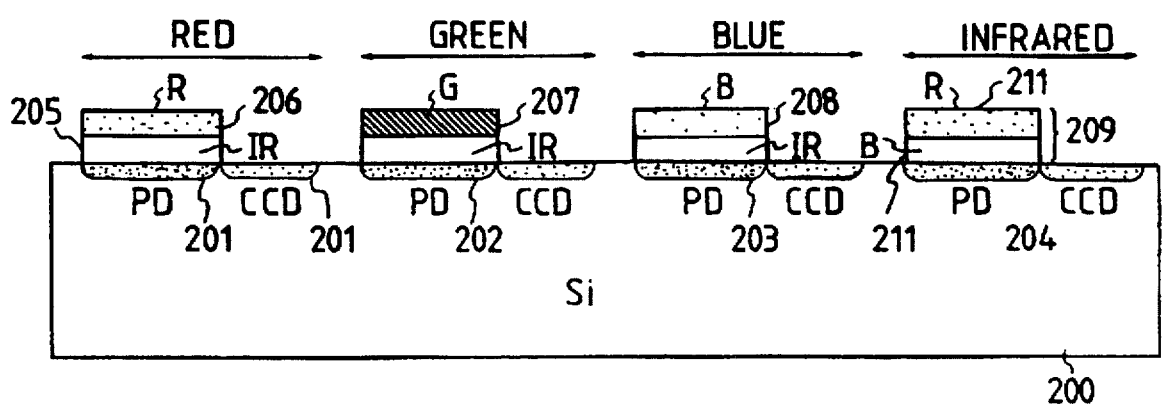
FIG. 28 is a sectional view showing a solid-state image pickup device according to embodiment 2-1 of the present invention.

FIG. 28 is a sectional view showing a solid-state image pickup device as an image sensor according to embodiment 2-1.

Filters for realizing the function according to the present invention are respectively formed on photodiodes 201 to 204 as photoelectric conversion elements formed on a single Si substrate 100. A CCD 201 for transferring a signal is arranged adjacent to each photodiode.

Figure 29:
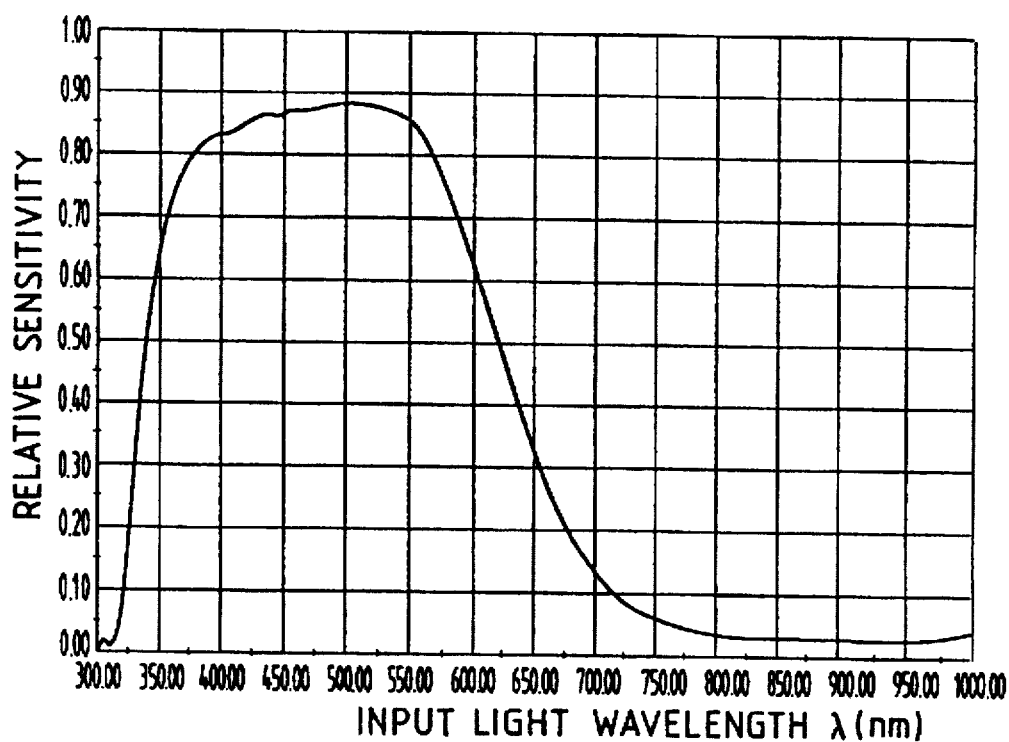
FIG. 29 is a graph showing the spectrum property of an infrared cut filter used in the present invention.

The photodiodes 201 to 203 absorb an optical signal in a visible light range, and the photodiode 204 absorbs an optical signal in an infrared range as an invisible light range. Then, the photodiodes 201 to 204 generate photocarriers. For this reason, infrared cut filters 205 are formed on the photodiodes 201 to 203. Each infrared cut filter 205 can be manufactured by a method utilizing interference of light. More specifically, thin films of a low-refractive index material such as $SiO_2$ and a high-refractive index material such as $TiO_2$ are alternately stacked to realize the property, as shown in, e.g., FIG. 29. Such a filter 205 is patterned into a desired pattern to be formed on only a desired region. On the infrared cut filters 205, R, G, and B cut filters 206 to 208 for respectively transmitting light components in R, G, and B ranges are respectively formed in correspondence with the photodiodes 201 to 203. The R, G, and B filters 206 to 208 can be manufactured by a method utilizing selective absorption of light. More specifically, a "dyed filter" which is dyed with a dyestuff after a pattern is formed using a photosensitive dyeable resin, or a "colored resist filter" which is formed by mixing a dyestuff in a photosensitive resin, and forming a colored resin pattern using the resin mixture by only photolithography is used, and the spectrum properties in the corresponding visible ranges can be obtained, as shown in FIG. 2.

On the other hand, a visible light cut filter 209 is formed on the photodiode 204 to read information in the infrared range. The visible light cut filter 209 can be easily realized by the above-mentioned method utilizing interference of light or the method utilizing selective absorption of light. However, in this embodiment, the spectrum property shown in, e.g., FIG. 3 is realized by stacking an R filter 210 and a B filter 211.

In this embodiment, the R, G, and B color filters 206 to 208 are arranged after the IR cut filters 205 are formed. This arrangement is effective when the IR filter requires a deposition temperature of, e.g., 200° C. or higher, and this temperature is higher than the heat-resistance temperature (about 150° C.) of, e.g., dyed color filters.

Furthermore, the infrared cut filters 205 may be commonly formed to be a continuous layer on the photodiodes 201 to 203 in place of forming independent filters in units of R, G, and B photodiodes.

(Embodiment 2-2)

Figure 30:
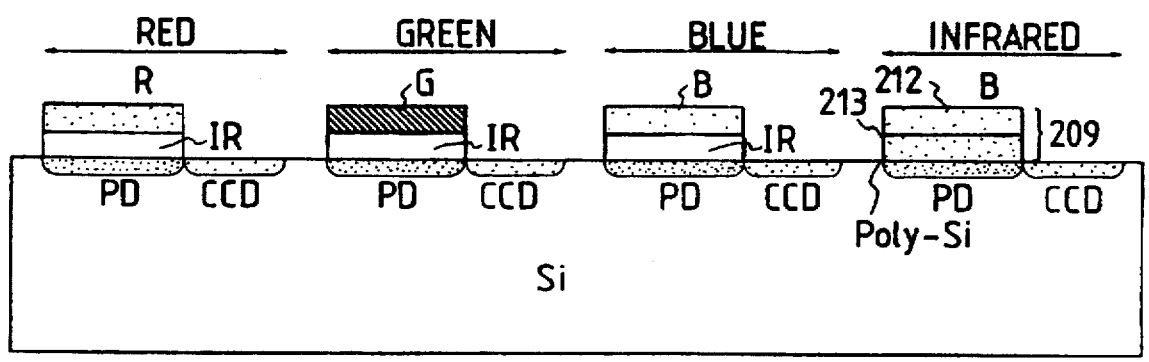
FIG. 30 is a sectional view showing a solid-state image pickup device according to embodiment 2-2 of the present invention.

FIG. 30 is a sectional view showing a solid-state image pickup device as an image sensor according to embodiment 2-2.

The arrangement of this embodiment is substantially the same as that of embodiment 2-1, except for the structure of photoelectric conversion elements for converting an optical signal in an infrared range into an electrical signal.

Figure 31:
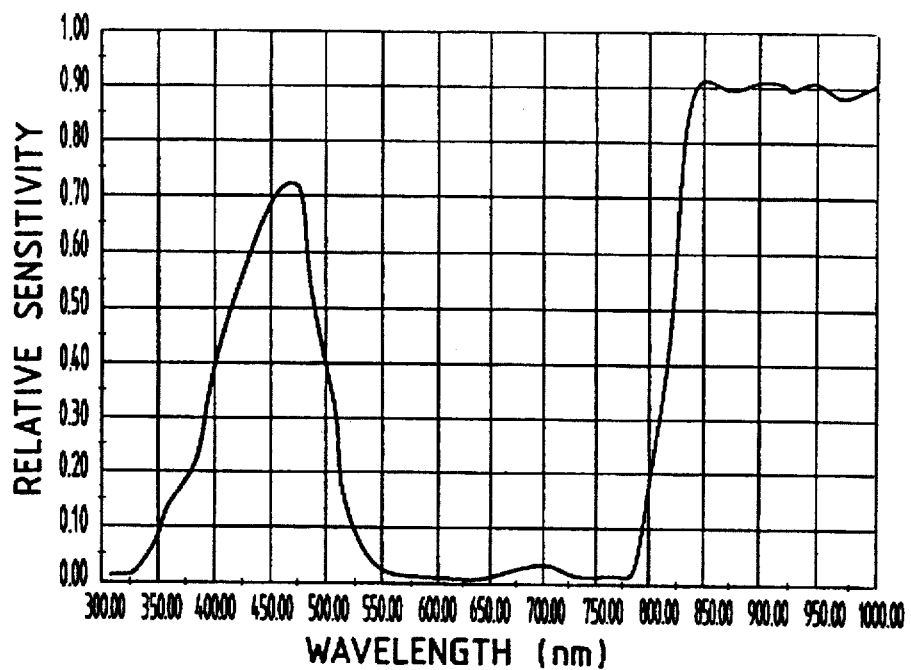
FIG. 31 is a graph showing the spectrum property of a blue filter used in the present invention.

A polycrystalline silicon layer (p-Si layer) 213 and a B filter 212 are stacked on a photodiode 204. The B filter is the same as the B filter 208 shown in FIG. 28, and exhibits the spectrum property shown in FIG. 31.

Figure 32:
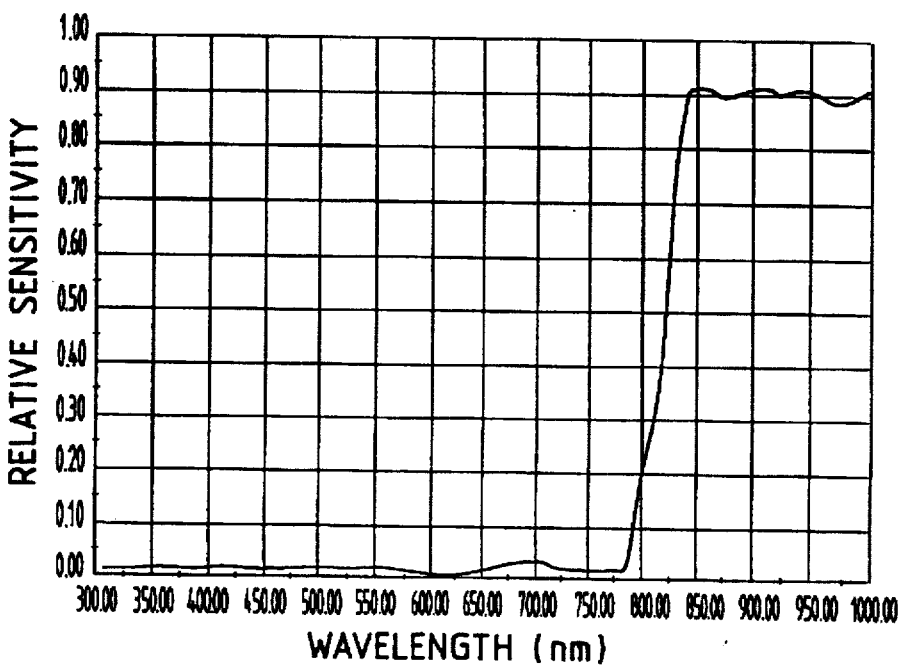
FIG. 32 is a graph showing the spectrum property of another visible light cut filter used in the present invention.

On the other hand, since the p-Si layer 213 can have a desire property (absorption property) in a wavelength range having a lower limit equal to or lower than 500 nm by changing its thickness, the visible light cut property shown in FIG. 32 can be provided to a filter 209.

In this embodiment, since the R, G, and B color filters are arranged only on a single plane, formation of the color filters is facilitated as compared to embodiment 2-1.

(Embodiment 2-3)

Figure 33:
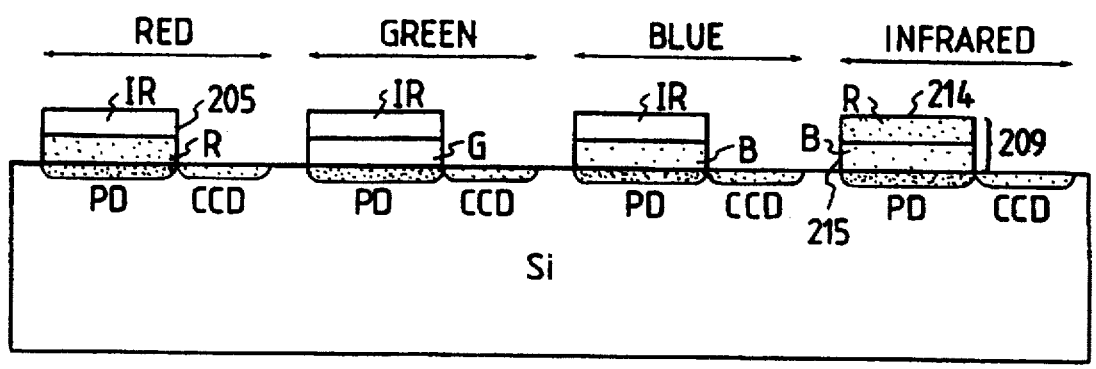
FIG. 33 is a sectional view showing a solid-state image pickup device according to embodiment 2-3 of the present invention.

FIG. 33 is a sectional view showing a solid-state image pickup device as an image sensor according to embodiment 2-3.

The arrangement of this embodiment is substantially the same as that of embodiment 2-1, except for the structure of photoelectric conversion elements for converting an optical signal in an infrared range into an electrical signal, and the arrangement of an IR cut filter 205 and R, G, and B filters.

An R filter 214 and a B filter 215 are stacked on a photodiode 204. The R and B filters 214 and 215 are respectively the same as the R and B filters 206 and 208 shown in FIG. 28, and exhibit substantially the same spectrum property as that shown in FIG. 31.

This embodiment is effective when the thickness of the IR cut filter is large. In such a case, in embodiment 2-1, since color filters must be formed after a large step is created upon formation of the IR cut filter, it is difficult to stably form the color filters with high precision. In this embodiment, since color filters are arranged on photodiodes with small steps, formation of the color filters is facilitated. In addition, since the IR cut filter is formed in the last process, even when the IR cut filter has a large thickness to obtain a desired spectrum property, it does not pose any problem. Furthermore, this embodiment is also effective when the temperature required for forming the R, G, and B color filters exceeds the heat resistance of the IR cut filter.

(Embodiment 2-4)

Figure 34:
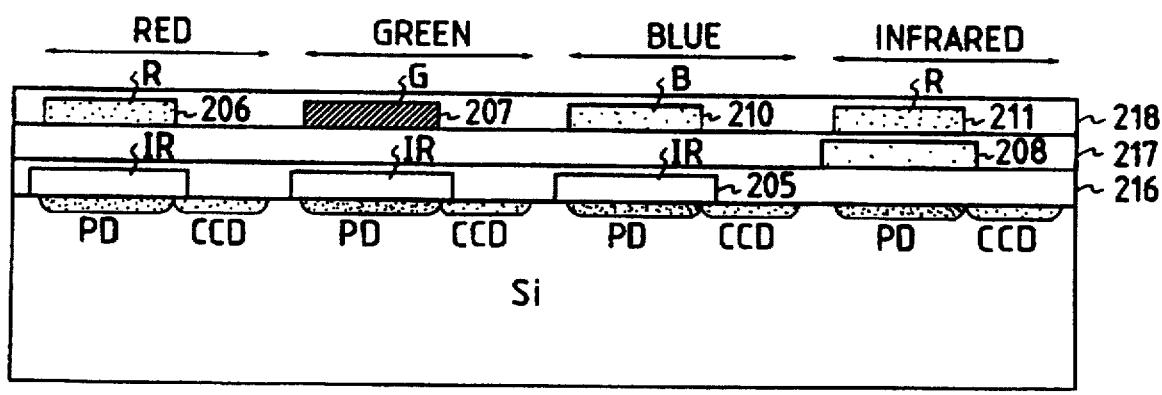
FIG. 34 is a sectional view showing a solid-state image pickup device according to embodiment 2-4 of the present invention.

FIG. 34 is a sectional view showing a solid-state image pickup device as an image sensor according to embodiment 2-4.

The arrangement of this embodiment is substantially the same as that of embodiment 2-1, except for the arranging positions of filters 206, 207, 208, 210, and 211.

In this embodiment, in order to form filters on photodiodes with precision as high as possible, a flat layer 216 is formed between an IR cut filter 205 and a B filter 208. The filter 208 is formed on the flat surface of the layer 216, and another flat layer 217 is formed thereon. Filters 206, 207, 210, and 211 are separately formed on the flat surface of the layer 117. A similar flat layer 218 is formed on the filters 206, 207, 210, and 211, thus forming a flat light incident surface.

As these layers 216, 217, and 218, a transparent film having a refractive index of, e.g., about 1.49 is used.

The present invention is not limited to the arranging order of the R, G, and B color filters, and the formation order of the color filters in this embodiment. Since a step created upon formation of an IR cut filter is flattened, the color filters can be stably formed with high precision in a later process.

(Embodiment 2-5)

Figure 39:
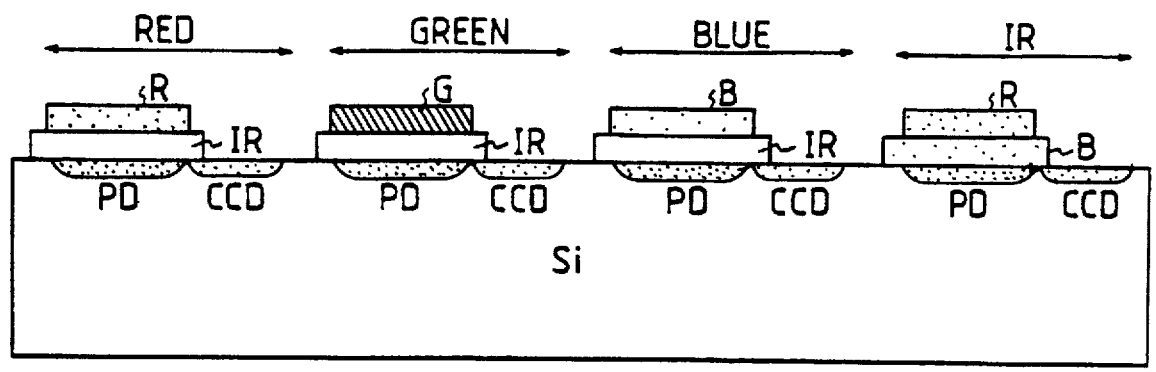
FIG. 39 is a sectional view showing a solid-state image pickup device according to embodiment 2-5 of the present invention.

FIG. 39 is a sectional view showing a solid-state image pickup device as an image sensor according to embodiment 2-5.

A difference from embodiment 2-1 is that, of two filter layers formed on the photodiodes, the lower layer has a larger pattern size than that of the upper layer. In this embodiment, since the pattern of the second layer is smaller than that of the first pattern, formation of the pattern of the second layer is not easily influenced by the steps of the filters of the first layer, thus improving precision and stability.

(Scanning Circuit)

The solid-state image pickup device as the image sensor described above is preferably constituted as an integrated circuit in which a scanning circuit as a read circuit is integrally formed on a single substrate together with pixel arrays including photoelectric conversion elements. As the scanning circuit, one of or a proper combination of a CCD type shift register, a CCD type transfer gate, a shift register using transistors, and a transfer gate using transistors is used. Also, storage capacitors for storing photoelectrically converted electrical signals may be arranged as needed.

Figure 35:
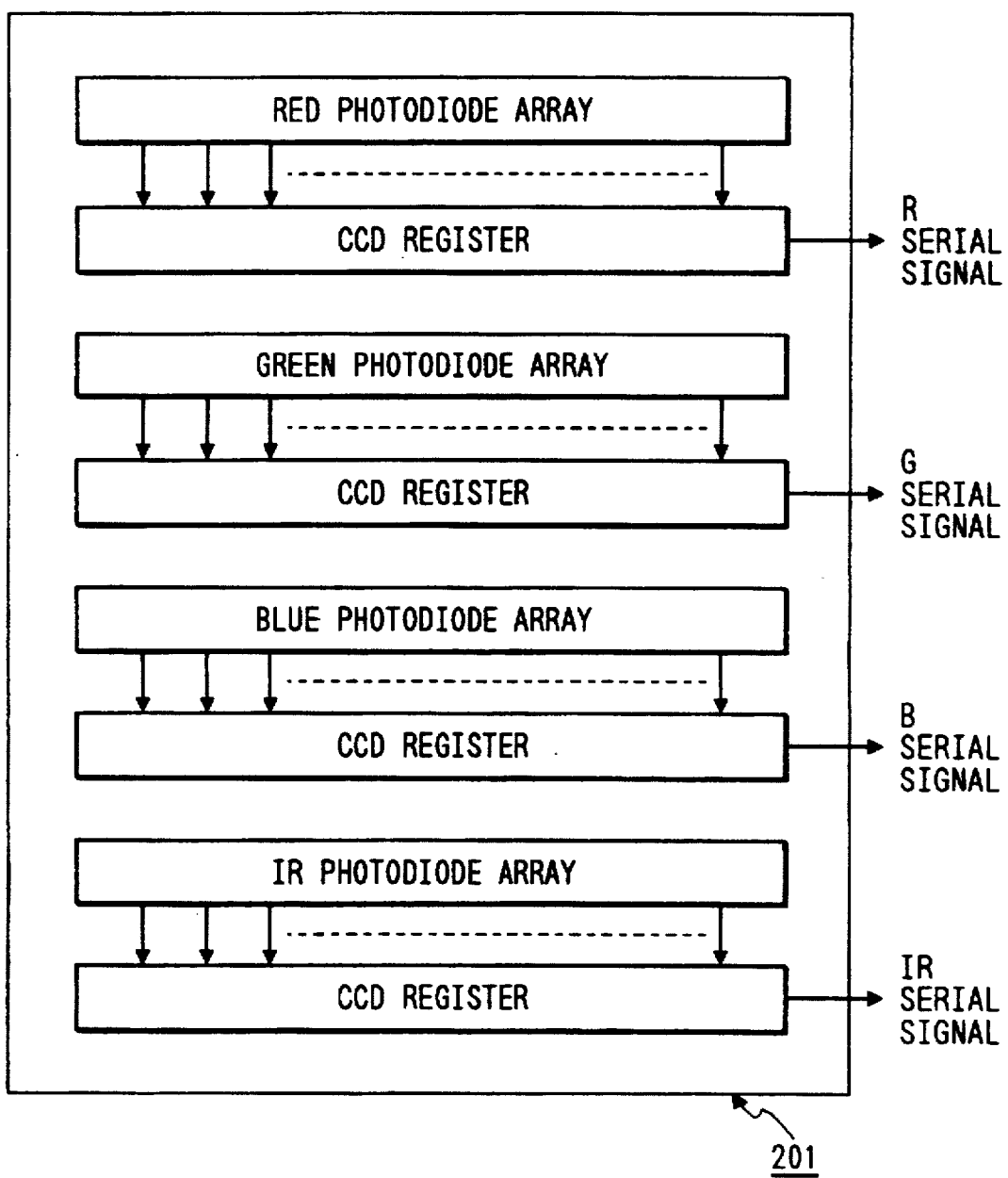
FIG. 35 is a block diagram showing a scanning circuit of a solid-state image pickup device used in the present invention.

In the arrangement shown in FIG. 35, after signals from photodiodes in the sensor arrays shown in FIG. 27 are transferred to corresponding CCD registers, signals are serially read out in units of colors.

Figure 36:
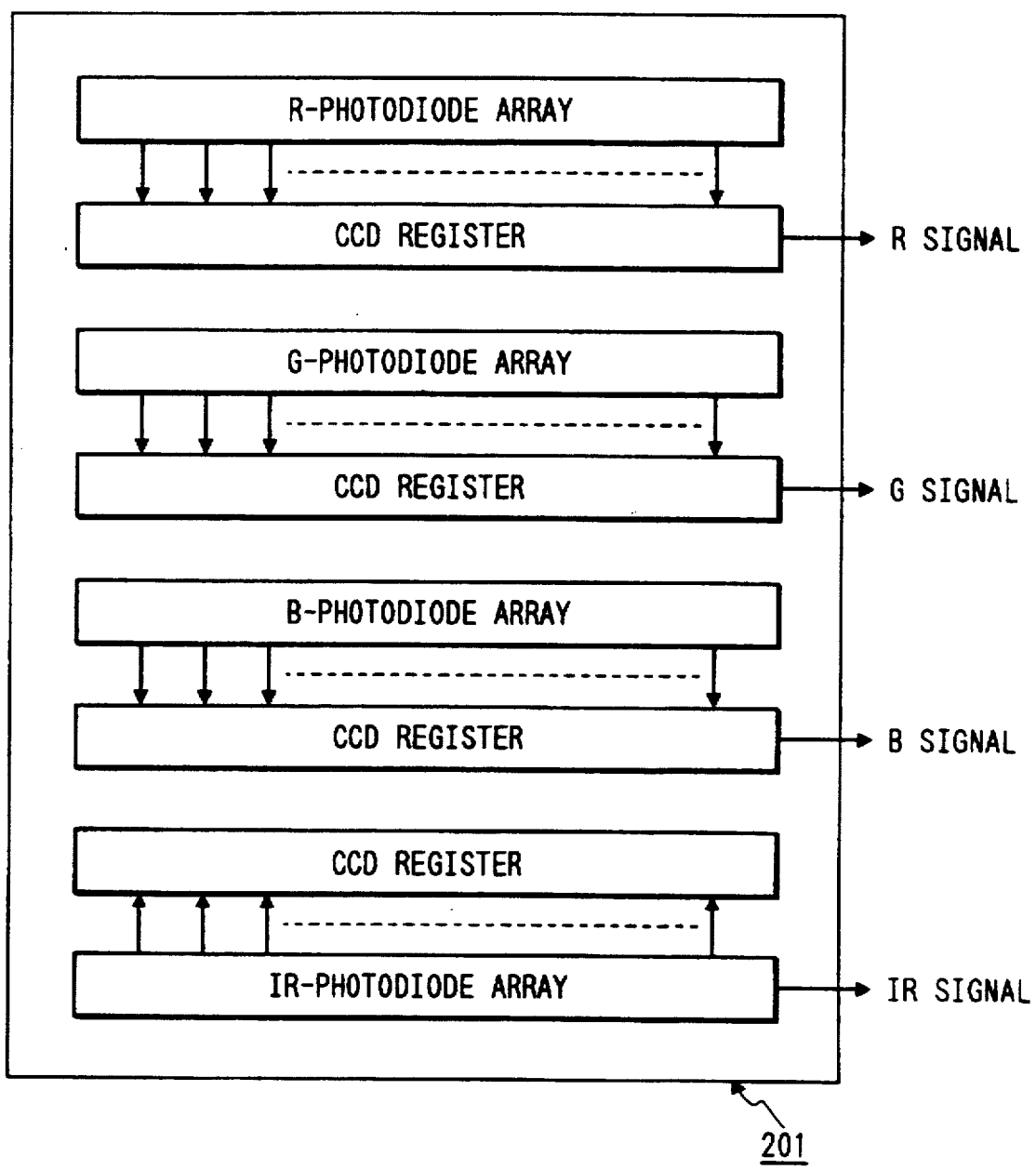
FIG. 36 is a block diagram showing another scanning circuit of a solid-state image pickup device used in the present invention.

FIG. 36 shows another arrangement. Of signals from the photodiodes, R, G, and B signals are transferred to three visible CCD registers, and an IR signal is transferred to an infrared CCD register opposing the CCD register for the B signal. Thereafter, the R, G, and B outputs, and the IR output are independently and parallelly read out.

Figure 37:
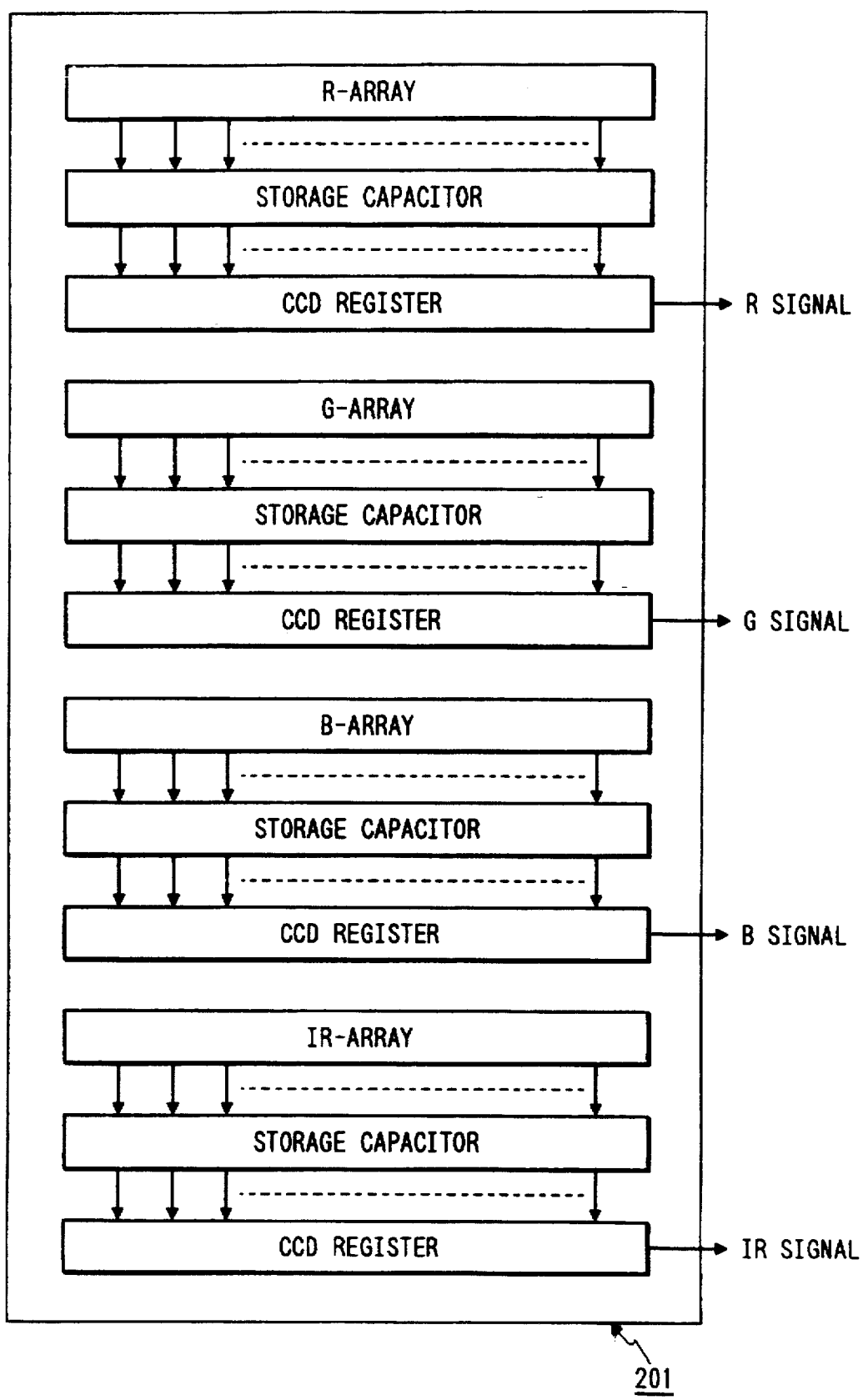
FIG. 37 is a block diagram showing still another scanning circuit of a solid-state image pickup device used in the present invention.

FIG. 37 shows still another arrangement. Signals from the photodiode arrays are simultaneously transferred to storage capacitors corresponding to the photodiodes, and are temporarily stored therein. Thereafter, the stored signals are sequentially read out by a selective scanning circuit. In this case, since the signals can be independently output from the storage capacitors in units of photodiodes, R, G, B, and IR signals can be parallelly read out.

Figure 38:
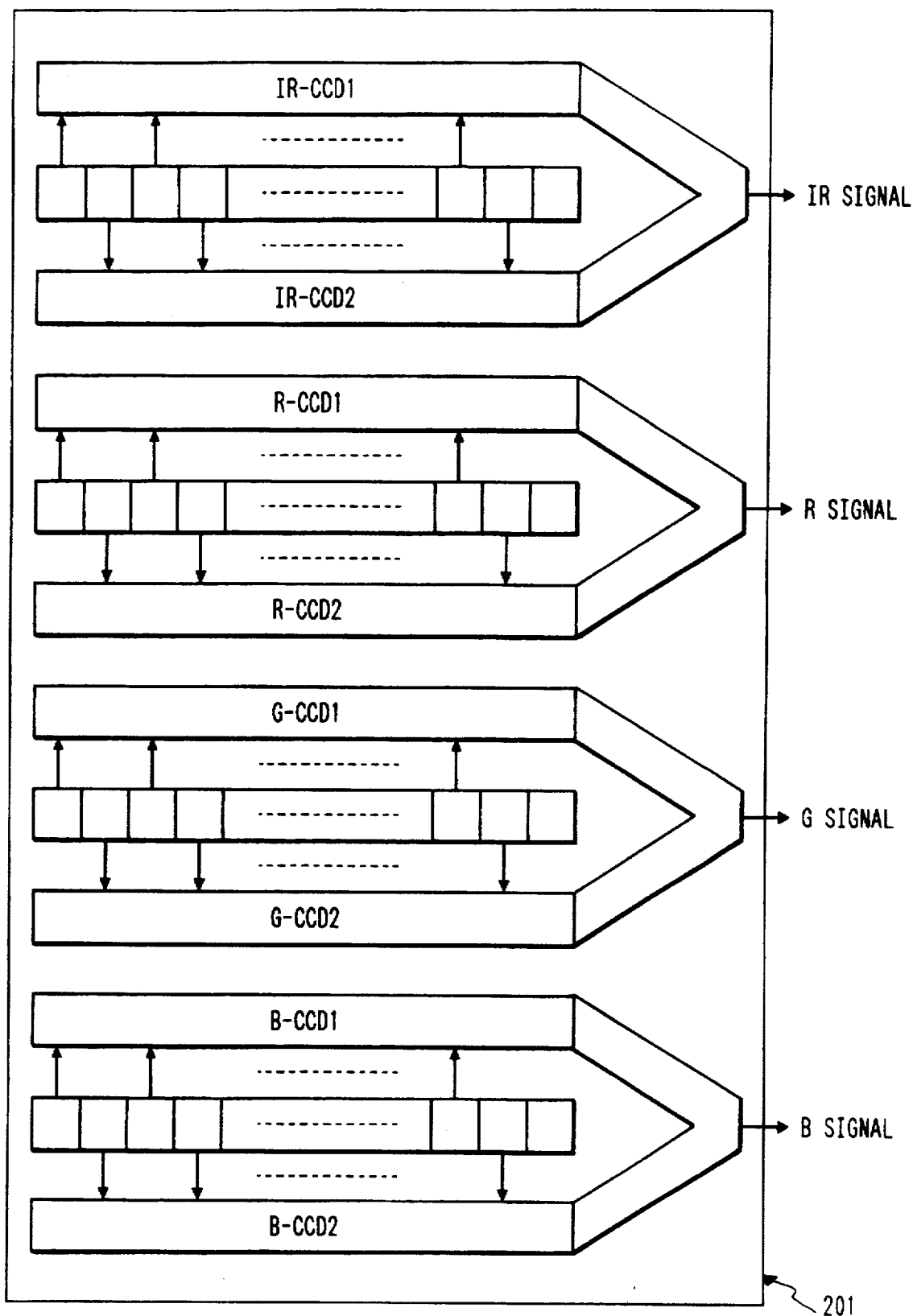
FIG. 38 is a block diagram showing still another scanning circuit of a solid-state image pickup device used in the present invention.

FIG. 38 shows still another arrangement. Each sensor array has two, i.e., upper and lower CCD registers which respectively store odd and even signals. Thus, visible R, G, and B signals, and an infrared IR signal are separately read out from the upper and lower registers.

(Embodiment 3-1)

Figure 40:
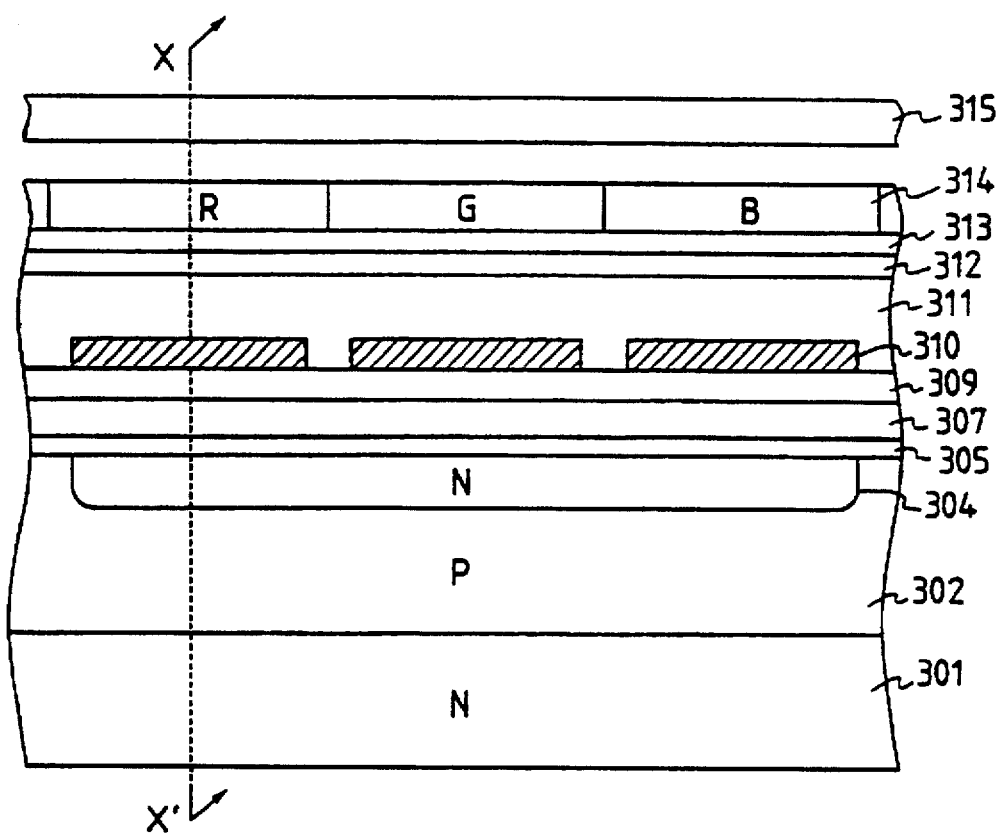
FIG. 40 is a sectional view of an optical sensor according to embodiment 3-1 of the present invention.
Figure 41:
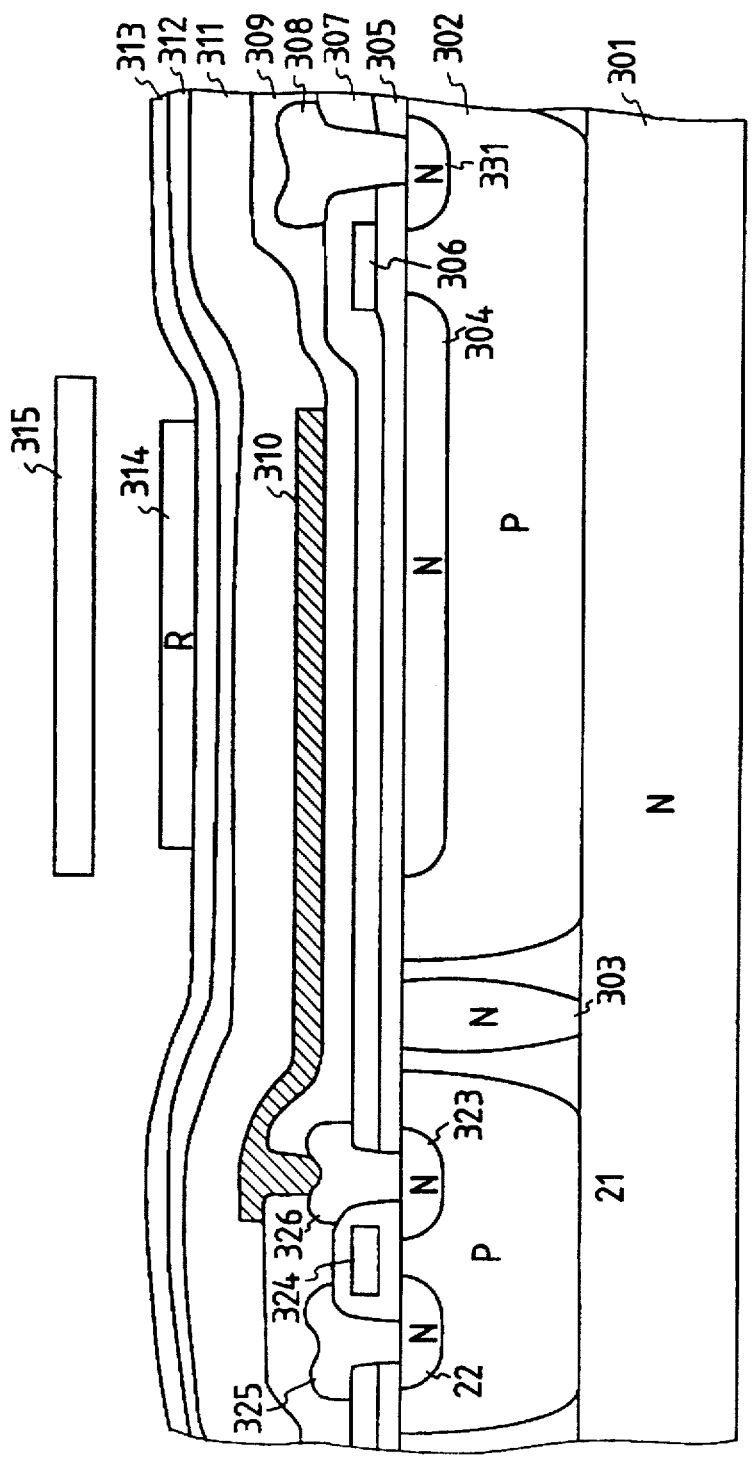
FIG. 41 is a sectional view of the optical sensor of embodiment 3-1 when viewed from a direction different from FIG. 40.
Figure 42:
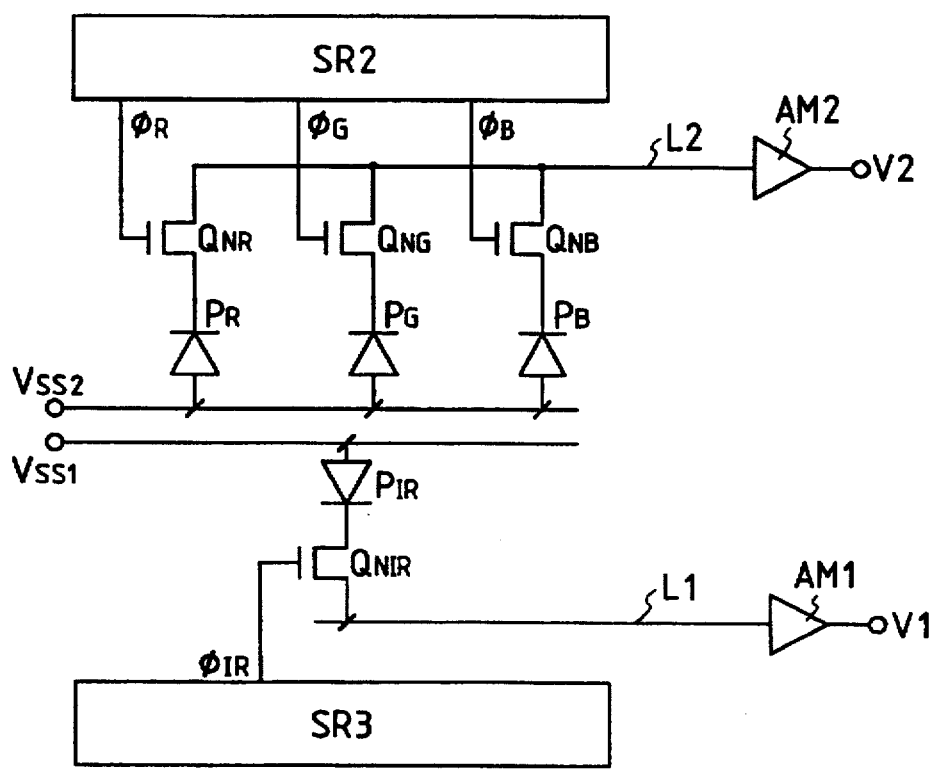
FIG. 42 is a circuit diagram of the optical sensor of embodiment 3-1.

FIG. 40 is a sectional view of an optical sensor according to embodiment 3-1 when viewed from a certain direction, FIG. 41 is a sectional view of the sensor taken along a line XX' in FIG. 40, and FIG. 42 is a circuit diagram of the sensor.

FIG. 40 particularly shows R, G, B, and IR elements. A p-type semiconductor layer 302 and an n-type semiconductor layer 304 are formed on an n-type Si substrate 301, whereby infrared light is detected.

Image electrodes 310 consisting of, e.g., Ti, are formed on the n-type semiconductor layer 304 via a thin insulating layer 305, and inter-layer insulating films 307 and 309. An a-Si layer 311 and a p-type Si layer 312 as non-monocrystalline semiconductor layers common to the R, G, and B elements, and a transparent electrode 313 consisting of, e.g., ITO, are formed on the image electrodes 310, whereby visible light is detected. In particular, since color filters 314 are selectively formed, the R, G, and B elements are arranged adjacent to each other. Also, a far infrared light cut filter 315 is formed, as needed. More specifically, visible light is received by multi-layered PI Shottky photodiodes each comprising the ITO electrode 313, the p-type Si layer 312, the a-Si layer 311, and the Ti electrode 310. Each of these photodiodes absorbs light satisfying a wavelength $\lambda \leq 750$ nm, and transmits light satisfying $\lambda \geq 750$ nm to the underlying layers. The thickness of each Ti electrode is about 150 Å, and the infrared light transmittance of the Ti layer with this thickness is designed to be about 30 to 50%. Infrared light is received by a monocrystalline Si PN (302, 304) diode. The thickness of the a-Si layer 311 is designed to be able to sufficiently absorb light satisfying $\lambda \leq 750$ nm. More particularly, the thickness of the a-Si layer 311 is set to be 2,000 Å or more, and more preferably, it is set to fall within a range from 5,000 Å to 1 µm. The individual electrodes are not limited to Ti but may consist of any other materials having a small work function. For example, Cr, Ta, or the like may be used. The thickness of each individual electrode is determined based on a transmittance (upper limit) and a resistance (lower limit) at which infrared light can be sufficiently detected.

Electrical signals obtained from visible light and infrared light are externally output as output signals V1 and V2 by transistors $Q_{NR}$, $Q_{NG}$, $Q_{NB}$, and $Q_{NIR}$ as individual switching elements via amplifiers AM1 and AM2.

The transistor $Q_{NR}$ has a P well 321, source/drain regions 322 and 323, a gate region 324, and source/drain electrodes 325 and 326.

On the other hand, the transistor $Q_{NIR}$ has source/drain regions 304 and 331 and a gate region 306, and other transistors $Q_{NG}$ and $Q_{NB}$ have the same structure as that of the transistor $Q_{NR}$.

When optical signals (R, G, B, and IR signals) including visible light and infrared light are radiated on the light-receiving portion of the sensor, electrical signals based on the visible light are generated by photodiodes $P_R$, $P_G$, and $P_B$, and an electrical signal based on the infrared light is generated by a photodiode $P_{IR}$. A shift register SR2 outputs pulses $\phi_R$, $\phi_G$, and $\phi_B$ for sequentially turning on the transistors $Q_{NR}$, $Q_{NG}$, and $Q_{NB}$, and R, G, and B signals are serially output onto a common line L2. On the other hand, a shift register SR1 outputs a pulse $\phi_{IR}$, and an IR signal is output onto a common line L1.

Since the serial visible light signals and the infrared light signal are obtained, independent processing operations can be performed when, for example, infrared light and visible light have different optical MTFs.

Figure 43:
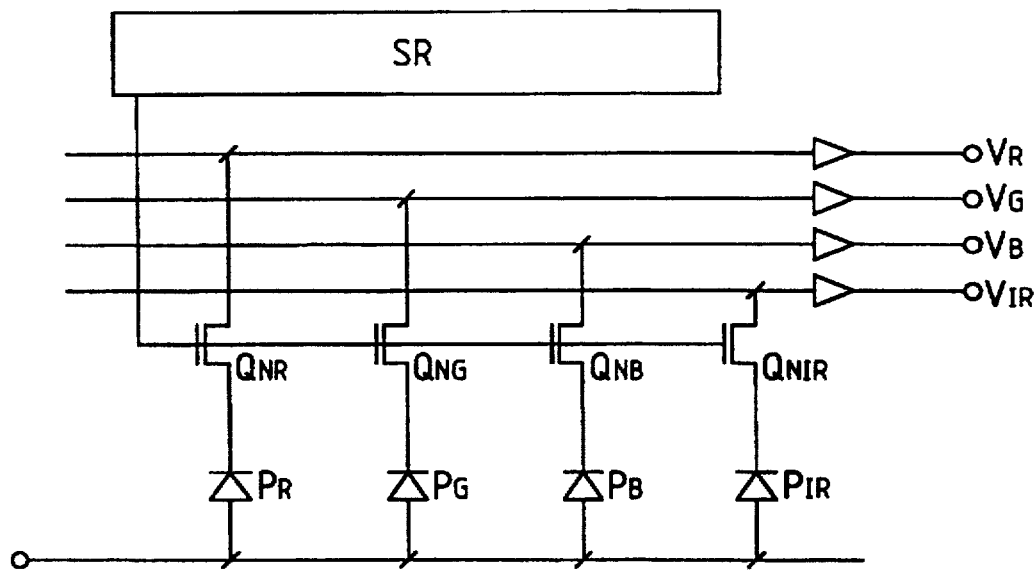
FIG. 43 is a circuit diagram showing another driving system of the optical sensor of embodiment 3-1.
Figure 44:
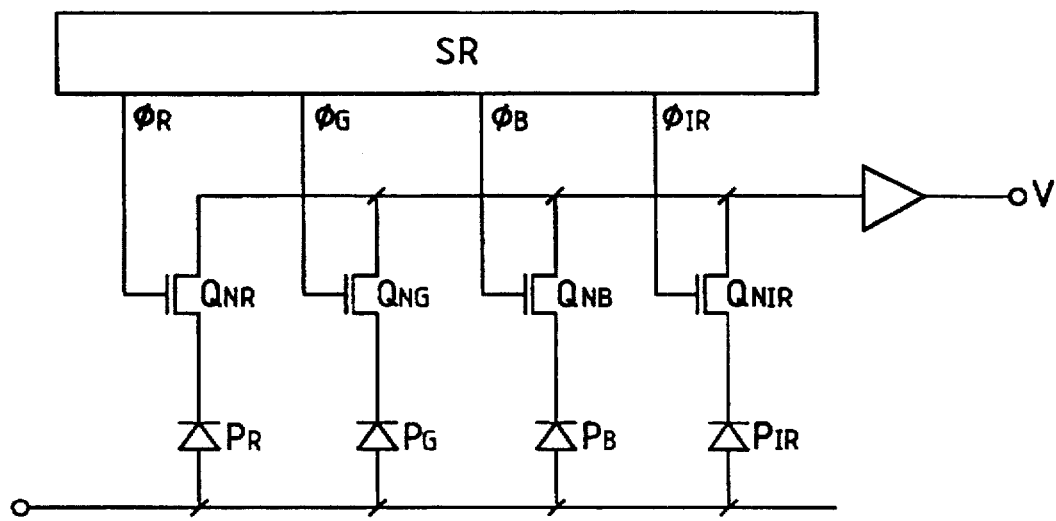
FIG. 44 is a circuit diagram showing still another driving system of the optical sensor of embodiment 3-1.

FIG. 43 shows another driving system of the optical sensor of the present invention. Four signals based on optical signals are parallelly output as output signals $V_R$, $V_G$, $V_B$, and $V_{IR}$ onto four lines. Thus, four signals can be read out at high speed. FIG. 44 shows still another system. Four signals based on optical signals are time-serially read out. This circuit is effective when the optical sensor is rendered more compact.

(Manufacturing Method)

An n-type monocrystalline Si wafer is prepared as a substrate 301, and an epitaxial layer is formed on the wafer. Ion implantation and an annealing are performed on the epitaxial layer to form the P wells 321 of the transistors Q and the cathode 302 of the IR photodiode. An isolation region 303 is formed by changing an impurity to be implanted, thereby preventing a crosstalk between the visible light signals and the IR signal, and blooming caused by an overflow of the IR signal.

After the thin insulating layer 305 consisting of $SiO_2$ for a gate insulating film is formed, the polysilicon gate regions 306 and 324 are formed, and thereafter, the source/drain regions 322, 323, 304, and 331 are formed by ion implantation. Thus, the gate terminals and the source/drain terminals are self-aligned.

Thereafter, the electrodes 325, 326, and 308, and the inter-layer insulating films 307 and 309 are formed.

Then, the visible light photodiodes are formed on the IR photodiode. A Ti film is sputtered, and is then patterned into individual electrode patterns. Then, a hydrogenated a-Si film as a semiconductor photoelectric conversion film, which can sufficiently absorb visible light and transmit infrared light, is formed by a glow discharge method. Typical conditions are as follows:

Gas composition $SiH_4$: 10 sccm, $H_2$: 50 sccm
Pressure 0.1 Torr
RF power 10 W (13.56 MHz)
Substrate Temperature 250° C.
Deposition rate 1.1 Å/sec The formed a-Si film has a band gap of 1.73 eV, and a dark conductivity of $6.1 \times 10^{-12}$ s/cm.

Figure 45:
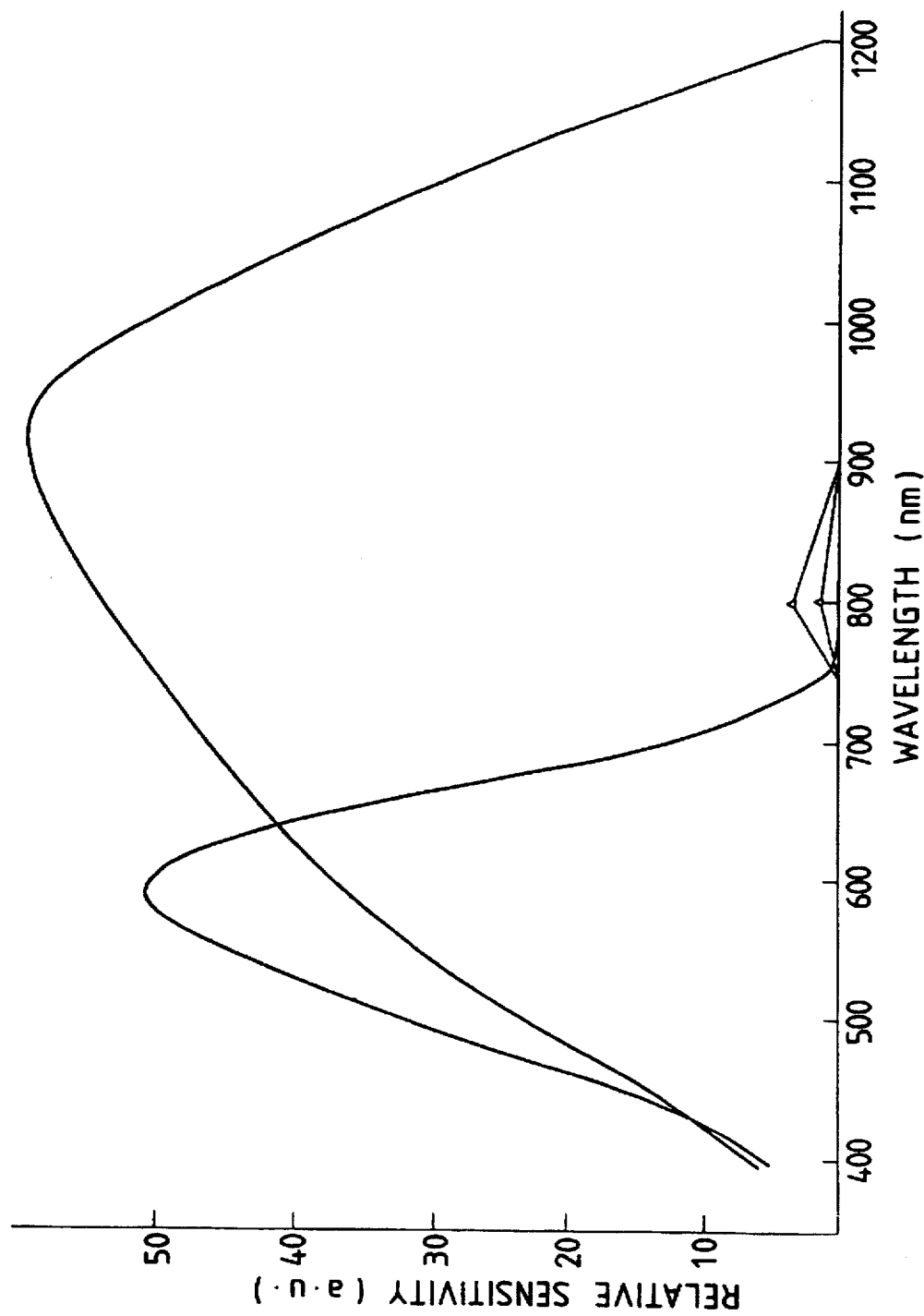
FIG. 45 is a graph showing the spectrum property of a photoelectric conversion layer used in the present invention.

FIG. 45 shows the spectrum property of the a-Si film as compared to that of monocrystalline Si. $B_2H_6$ or $BF_3$ is added to the gas mixture of $SiH_4$ and $H_2$, and the non-monocrystalline p-type Si film 312 is formed.

After the ITO electrode 313 is formed, the color filters 314 are formed thereon, thus completing the optical sensor.

Figure 46:
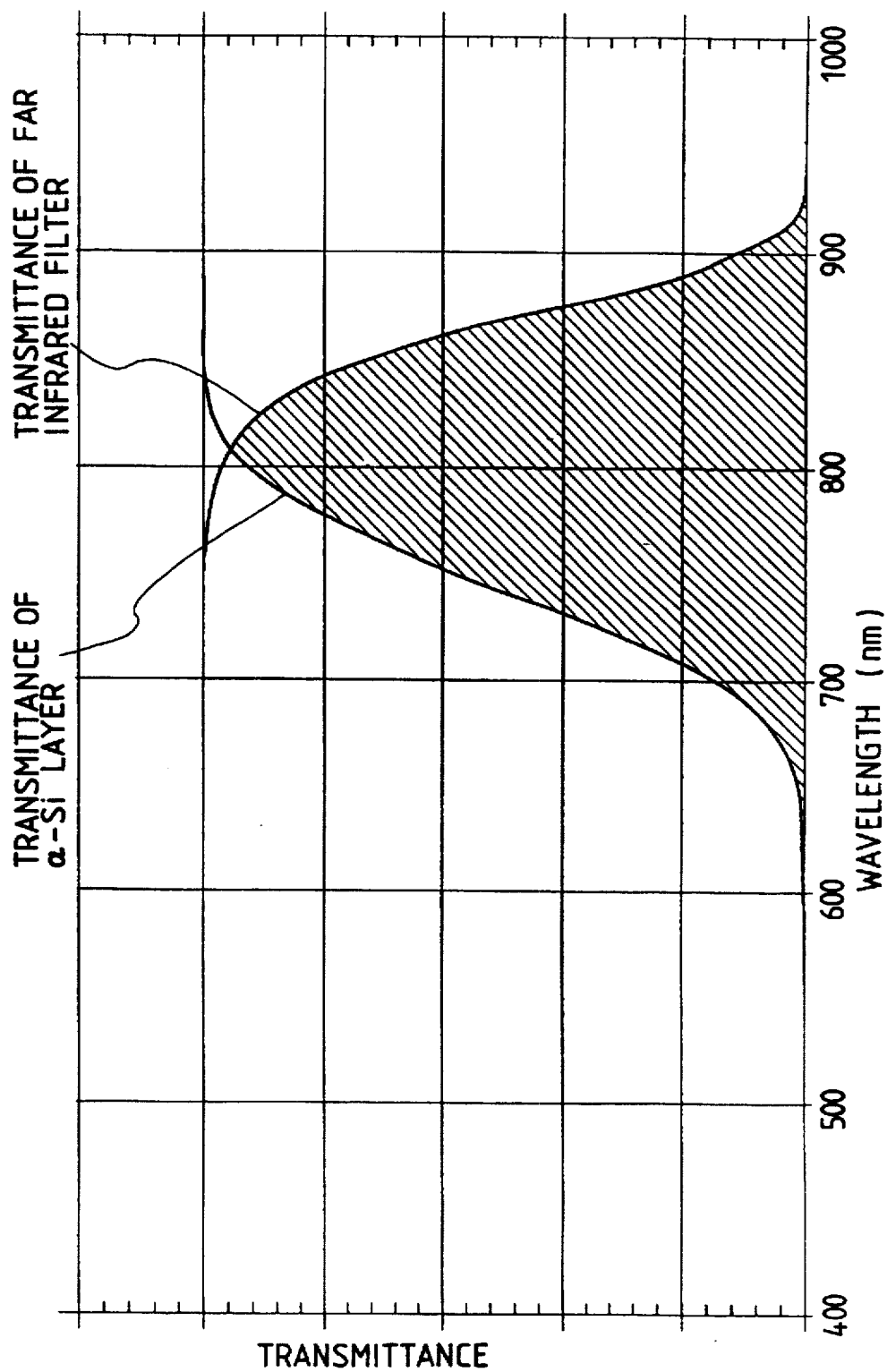
FIG. 46 is a graph showing the spectrum properties of the photoelectric conversion layer and a far infrared cut filter used in the present invention.
Figure 47:
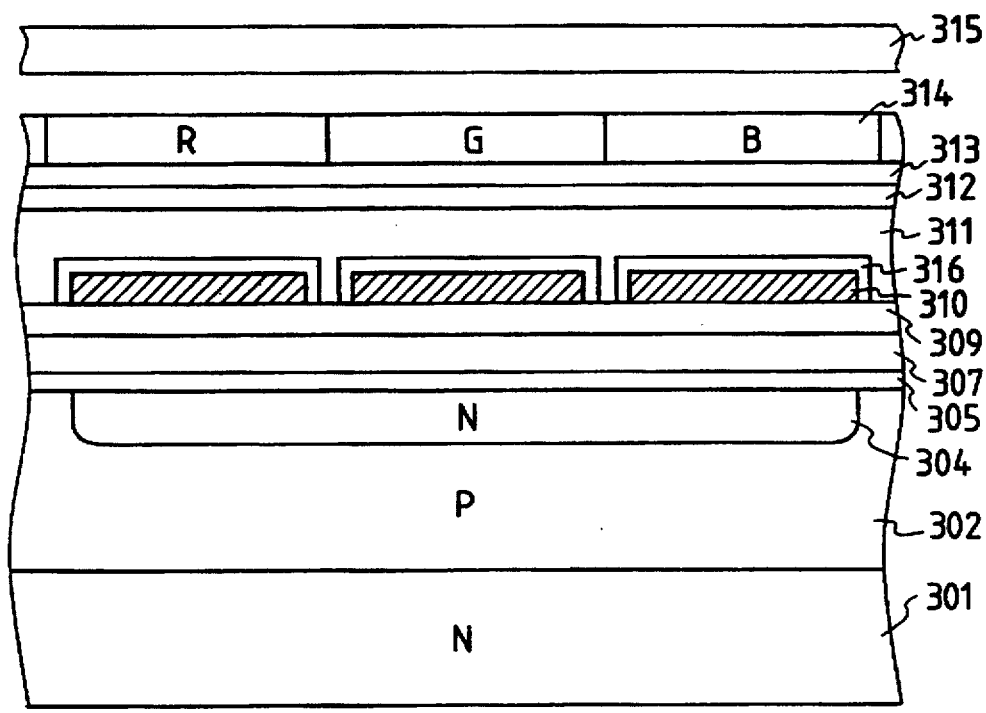
FIG. 47 is a sectional view of an optical sensor according to embodiment 3-3 of the present invention.
Figure 48:
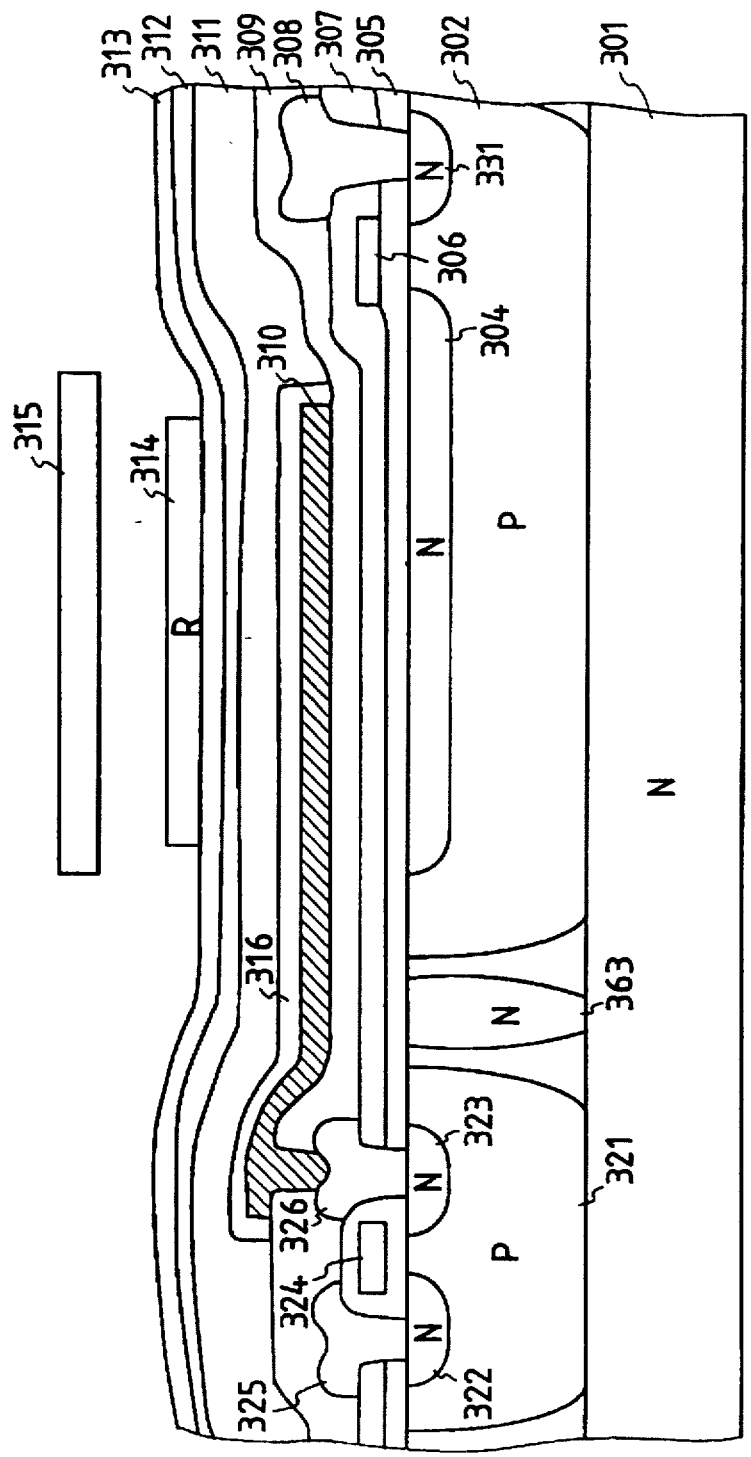
FIG. 48 is a sectional view of the optical sensor of embodiment 3-3 when viewed from a direction different from FIG. 40.
Figure 49:
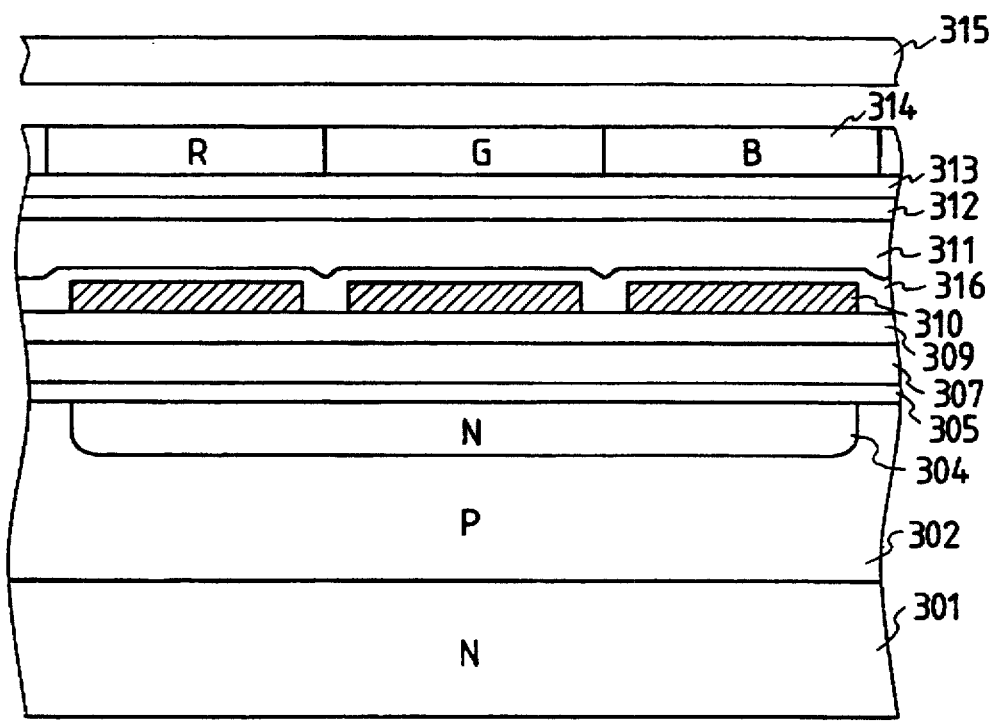
FIG. 49 is a sectional view of an optical sensor according to embodiment 3-4 of the present invention.
Figure 50:
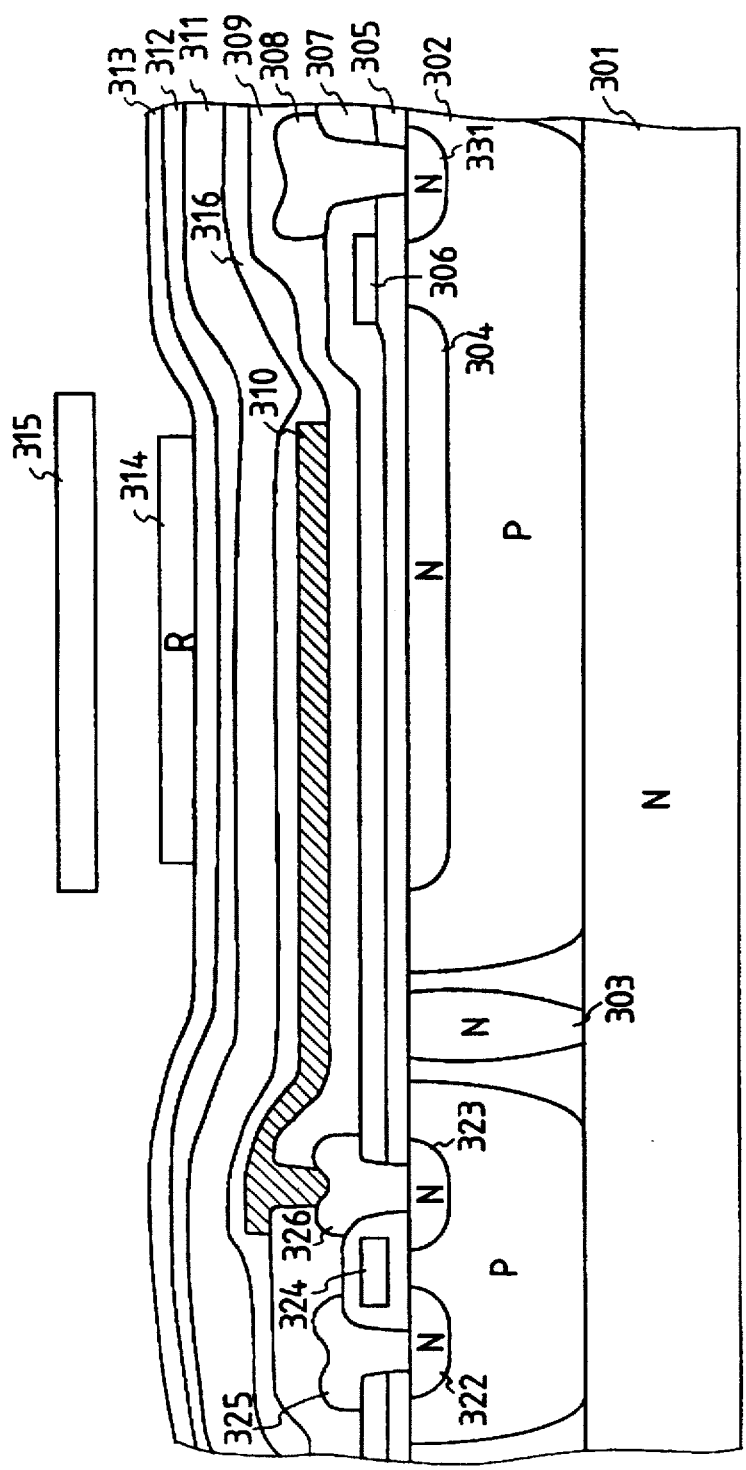
FIG. 50 is a sectional view of the optical sensor of embodiment 3-4 when viewed from a direction different from FIG. 40.

FIG. 46 shows the transmittance of the a-Si film 311 together with the property of the far infrared cut filter 315. Light in a range indicated by hatching in FIG. 46 is incident on the underlying IR photodiode.

(Embodiment 3-2)

This embodiment is a modification of the above embodiment, and has substantially the same structure as that of the above embodiment, except for a material of the individual electrodes 310.

In this embodiment, an n-type silicon film as an non-monocrystalline film is used as an electrode material in place of Ti.

According to this embodiment, visible photodiodes have a PIN structure, and a dark current can be further eliminated. In addition, the amount of infrared light reflected and absorbed by the individual electrodes 310 can be decreased, and this embodiment is effective for improving sensitivity of an IR signal.

(Embodiment 3-3)

This embodiment is a modification of embodiment 3-1, and n-type silicon layers 316 are individually formed between the individual electrodes 310 and the a-Si layer 311.

Other structures are the same as those in embodiment 3-1.

(Embodiment 3-4)

This embodiment is a modification of embodiment 3-1, and an amorphous silicon carbide (a-SiC) layer 316 is formed on the entire surface between the individual electrodes and the a-Si layer 311. As the a-SiC layer, a film having a band gap of 2.1 eV is formed to have a thickness of about 500 Å.

According to this embodiment, the isolation characteristics between the photoelectric conversion elements in the horizontal direction can be improved, and a crosstalk can be suppressed.

Other structures are the same as those in embodiment 3-1.
(Embodiment 3-5)

In this embodiment, the MOS transistors $Q_{NR}$, $Q_{NG}$, $Q_{NB}$, and $Q_{NIR}$ in embodiment 3-1 are replaced by bipolar transistors. More specifically, a-Si photodiodes are used as visible light sensors, photocarriers are stored in the base of an npn bipolar transistor as an infrared light sensor, and an IR signal is read out as a voltage to a capacitive load connected to the emitter.

Figure 51:
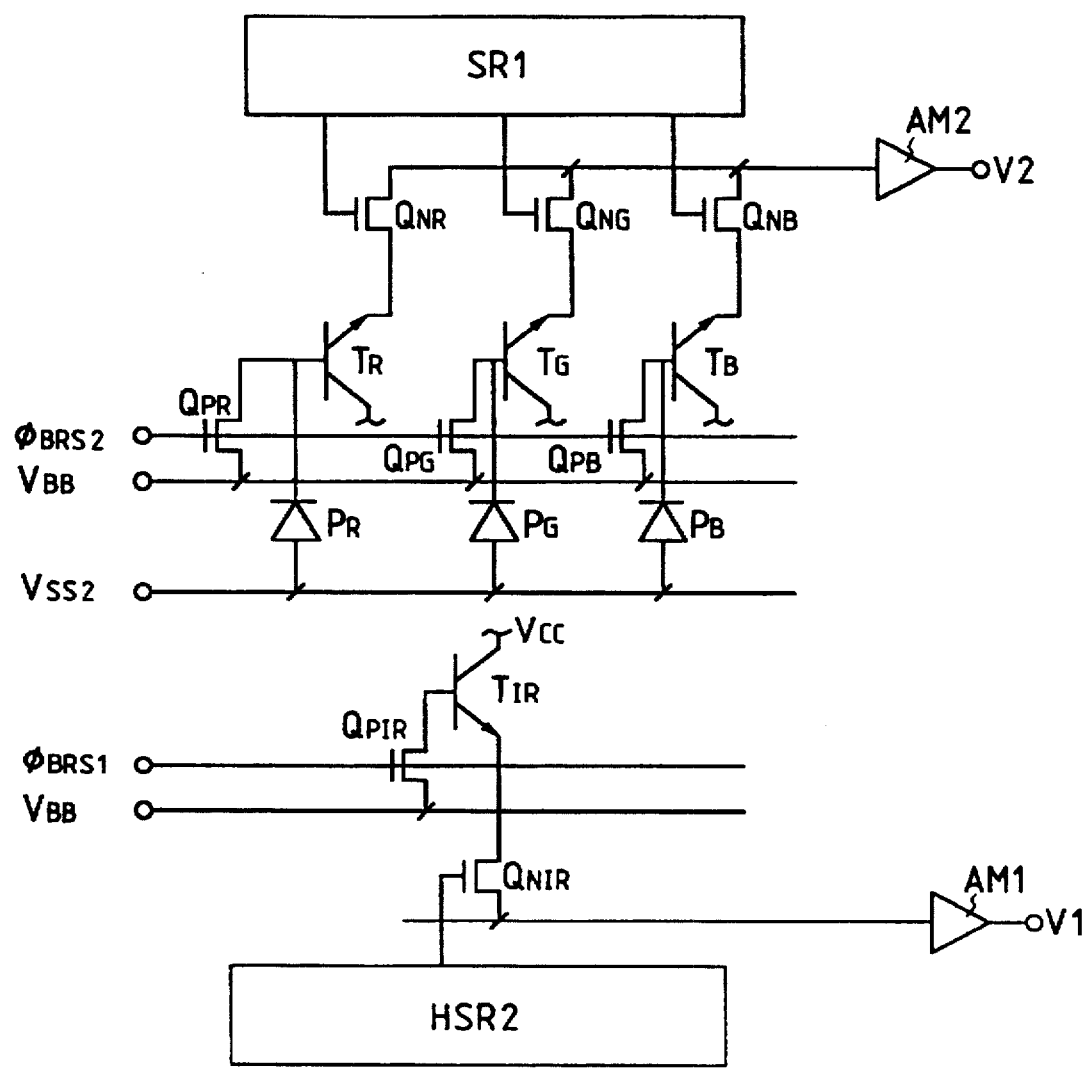
FIG. 51 is a circuit diagram of an optical sensor according to embodiment 3-5 of the present invention.
Figure 52:
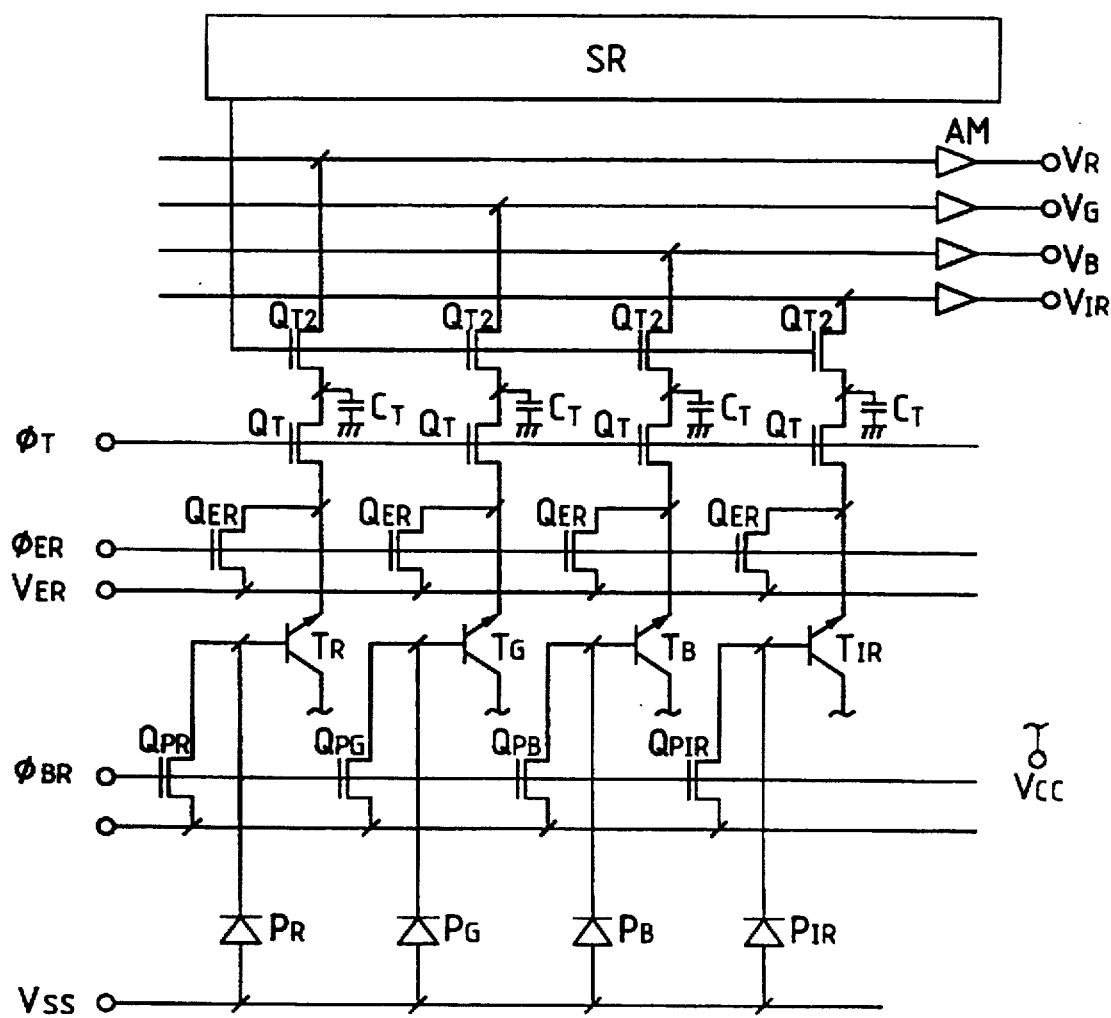
FIG. 52 is a circuit diagram of an optical sensor according to embodiment 3-6 of the present invention.

FIG. 51 is a circuit diagram of this embodiment.
(Embodiment 3-6)

FIG. 42 shows a modification of the circuit arrangement of the optical sensor according to embodiment 3-5.

Signals are stored in the bases of bipolar transistors $T_R$, $T_G$, $T_B$, and $T_{IR}$. When transistors $Q_T$ are turned on by a pulse $\phi_T$, amplified signals are read out as voltages to corresponding capacitive loads $C_T$. Thereafter, transistors $Q_{T2}$ are simultaneously turned on by a shift register SR, and the signals are parallelly read out as output signals $V_R$, $V_G$, $V_B$, and $V_{IR}$.

Transistors $Q_{PR}$, $Q_{PG}$, $Q_{PB}$, and $Q_{PIR}$, and a transistor $Q_{ER}$ are reset transistors, $\phi_T$, $\phi_{ER}$, and $\phi_{BR}$ are pulse sources, and $V_{ER}$, $V_{BR}$, $V_{SS}$, and $V_{CC}$ are reference voltage sources.
(Embodiment 3-7)

Figure 53:
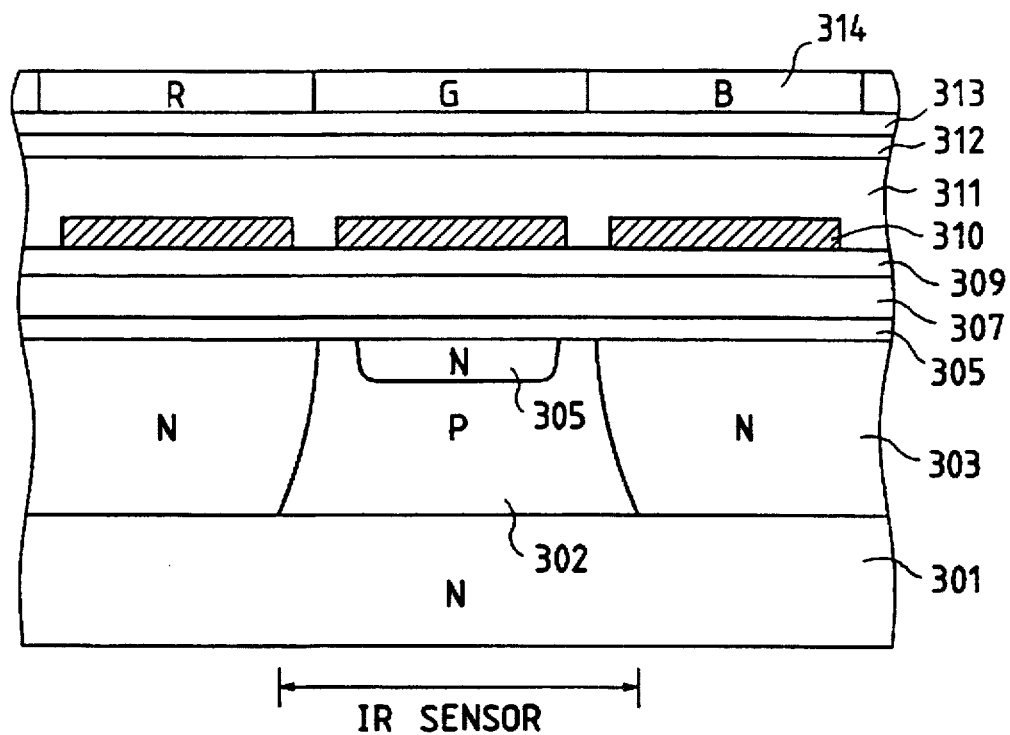
FIG. 53 is a sectional view of an optical sensor according to embodiment 3-7 of the present invention.

FIG. 53 is a sectional view of an optical sensor according to embodiment 3-7. The same reference numerals in FIG. 53 denote the same parts as in the above embodiments. A difference from the above embodiment is that an IR diode (302, 304) is formed under one of the three visible light elements, and the two remaining neighboring portions are formed as element isolation regions 303. With this structure, since a large element isolation region is present between two adjacent IR photoelectric conversion elements (302, 304), a crosstalk of IR signals can be further satisfactorily suppressed.
(Embodiment 3-8)

Figure 54:
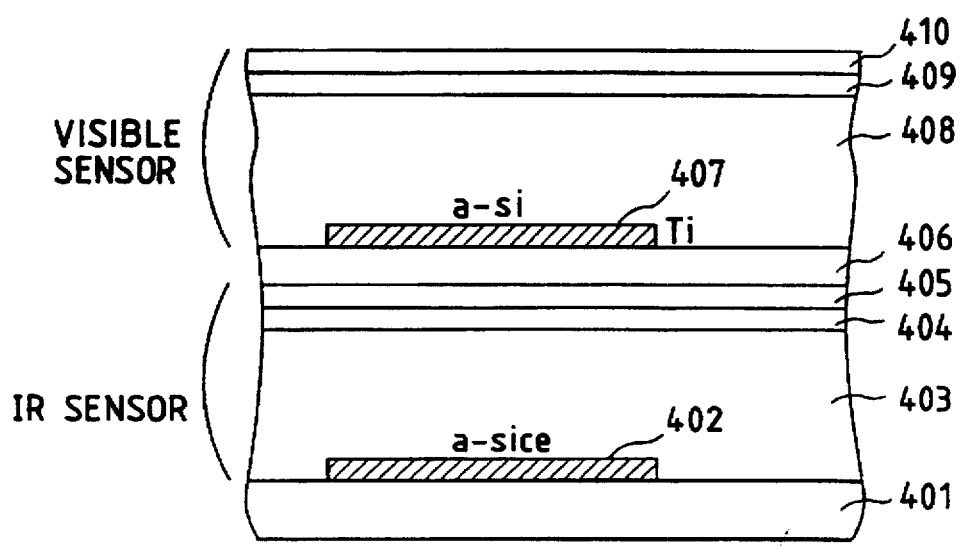
FIG. 54 is a sectional view of an optical sensor according to embodiment 3-8 of the present invention.

FIG. 54 is a sectional view showing an optical sensor according to this embodiment.

As an infrared light (IR) sensor for invisible light, a photodiode, which comprises an electrode 402, an amorphous silicon germanium (a-SiGe) layer 403 having a band gap of 1.40 to 1.48 eV, a p-type silicon layer 404, and a transparent electrode 405, which are formed on a substrate 401, is used.

On the other hand, as a visible light sensor, a photodiode, which comprises an individual electrode 407, an a-Si layer 408 having a band gap of 1.65 to 1.80 eV, a p-type silicon layer 409, and a transparent electrode 410, which are formed on an insulating film 406, is used.

Figure 55:
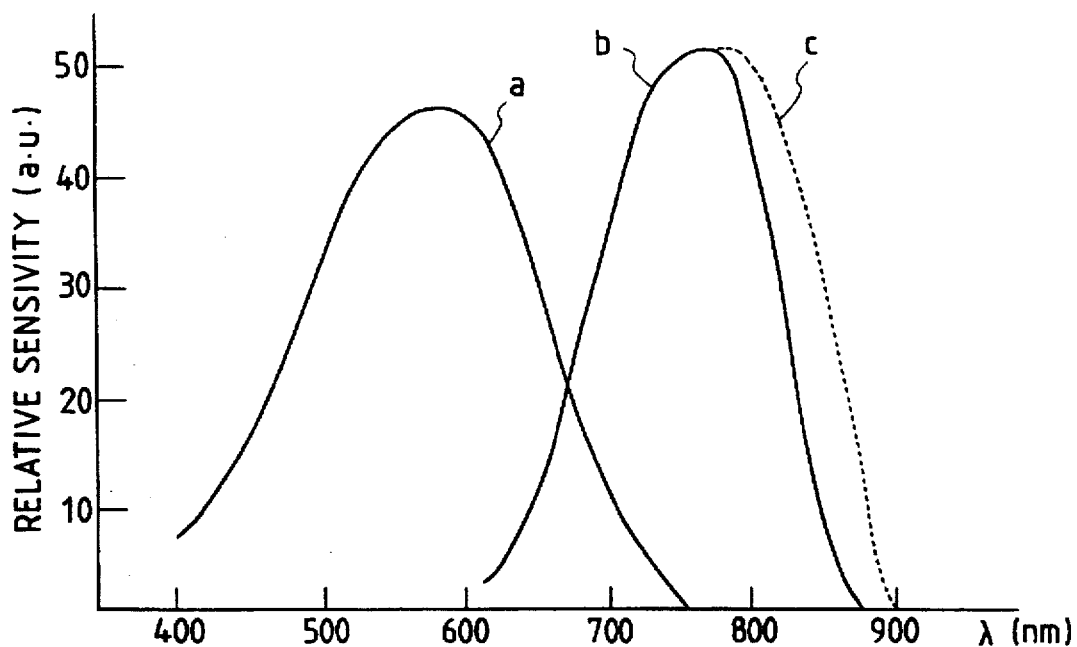
FIG. 55 is a graph showing the spectrum properties of photoelectric conversion layers used in embodiment 3-8.

FIG. 55 shows the sensitivity distribution of the optical sensor of this embodiment. A curve a represents the property of an a-Si layer having a band gap of 1.72 eV, a curve b represents the property of an a-SiGe layer having a band gap of 1.48 eV, and a broken curve c represents the property of an a-SiGe layer having a band gap of 1.40 eV.

As described above, by changing the constituting materials of semiconductors, a multi-layered sensor can be obtained.
(Embodiment 3-9)

In embodiment 3-9, each of photodiodes (310, 311, 312, 313) as visible light sensors in the optical sensor shown in FIG. 53 is replaced by an avalanche photodiode (APD).

Figure 56:
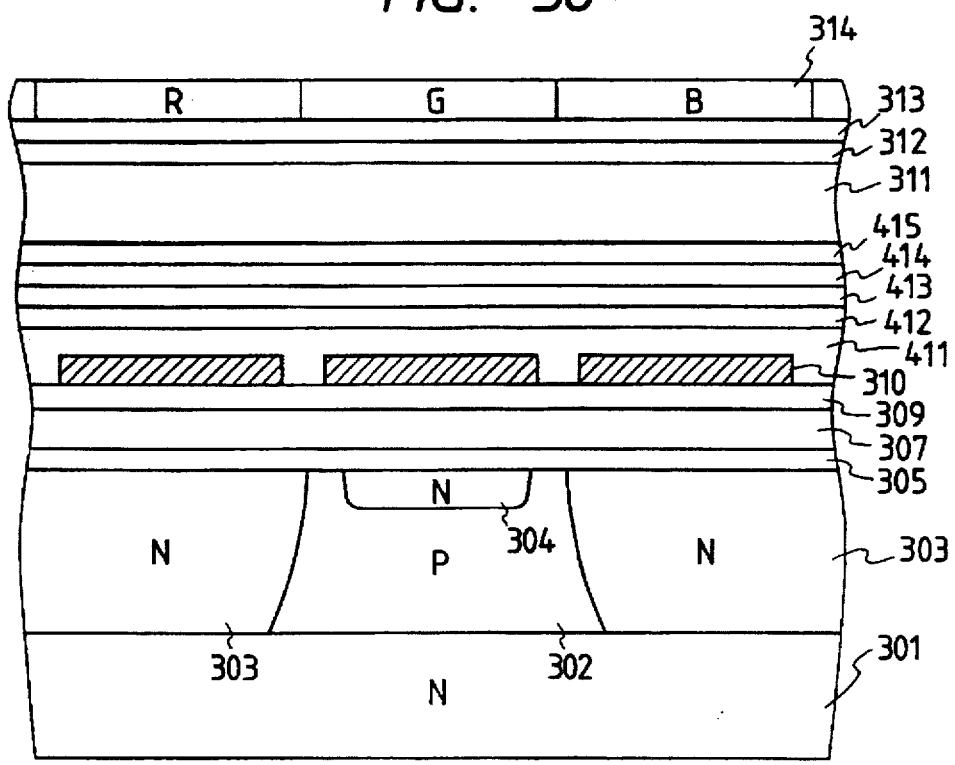
FIG. 56 is a sectional view of an optical sensor according to embodiment 3-9 of the present invention.

FIG. 56 is a sectional view of the sensor of this embodiment.

The sensor of this embodiment has, as an APD, a multi-layered structure in which a light absorption layer 311 and carrier multiplication layers 411, 412, 413, and 414 are functionally isolated.

A light-shielding/blocking layer 415 is formed to prevent injection of carriers in a direction opposite to the incident direction, thereby preventing visible light from becoming incident on the layers below the layer 415.

The layers 411 to 414 are amorphous semiconductor layers, whose band gaps continuously decrease from the lowermost layer toward the uppermost layer, and are constituted by property changing the composition ratio x:y:z of a-$Si_xGe_yC_z$. A principal energy gap is generated in either the conduction band or the valence band, and electrons or holes are ionized by the energy gap near the interfaces of the layers 111 to 114.

What is claimed is:

1. A solid-state image pick-up device comprising:
   a plurality of first photoelectric conversion elements for converting red light into electrical signals;
   a plurality of second photoelectric conversion elements for converting green light into electrical signals;
   a plurality of third photoelectric conversion elements for converting blue light into electrical signals; and
   a plurality of fourth photoelectric conversion elements for converting light not comprising red, green and blue light into electrical signals, said first, second, third and fourth photoelectric conversion elements being arranged in a line in a predetermined alternating order,
   wherein said solid-state image pick-up device has at least one of the following:
   (a) means for inputting in parallel the electric signals converted by said first, second, third and fourth photoelectric conversion elements, and for outputting in serial the electric signals from one output line;
   (b) means for inputting in parallel the electric signals converted by said first, second and third photoelectric conversion elements, and for outputting in serial the electric signals from at least one output line, and means for inputting in parallel only the electric signals converted by said fourth photoelectric conversion elements, and for outputting the input electric signals converted by said fourth photoelectric conversion elements from one output line serially; and
   (c) means for inputting in parallel the electric signals converted by said first, second, third and fourth photoelectric conversion elements, and for outputting the respective electric signals in serial to one of four output lines arranged in parallel.

2. A device according to claim 1, wherein each of said first, second and third photoelectric conversion elements comprises a photodiode and a color filter.

3. A device according to claim 1, wherein one of said first, second and third photoelectric conversion elements is between two of said fourth photoelectric conversion elements.

4. A solid-state image pick-up device comprising:
   a plurality of first photoelectric conversion elements for converting light of a first visible wavelength region into electrical signals;
   a plurality of second photoelectric conversion elements for converting light of a second visible wavelength region different from the first visible wavelength region into electrical signals;
   a plurality of third photoelectric conversion elements for converting light of a third visible wavelength region different from the first and second visible wavelength regions into electrical signals; and
   a plurality of fourth photoelectric conversion elements for converting non-visible light into electrical signals, said first, second, third and fourth photoelectric conversion elements being arranged in a line, in a predetermined alternative order, wherein said solid-state image pick-up device has at least one of the following:

(a) means for inputting in parallel the electric signals converted by said first, second, third and fourth photoelectric conversion elements, and for outputting in serial the electric signals from one output line;

(b) means for inputting in parallel the electric signals converted by said first, second and third photoelectric conversion elements, and for outputting in serial the electric signals from at least one output line, and means for inputting in parallel only the electric signals converted by said fourth photoelectric conversion elements, and for outputting the input electric signals converted by said fourth photoelectric conversion elements from one output line serially; and (c) means for inputting in parallel the electric signals converted by said first, second, third and fourth photoelectric conversion elements, and for outputting the respective electric signals in serial to one of four output lines arranged in parallel.

5. An image information processing apparatus comprising:

illumination means for illuminating an original to obtain an optical signal; and image pickup means for picking up the optical signal, said image pickup means comprising (1) a plurality of first photoelectric conversion elements for converting red light of the optical signal into electrical signals, (2) a plurality of second photoelectric conversion elements for converting green light of the optical signal into electrical signals, (3) a plurality of third photoelectric conversion elements for converting blue light of the optical signal into electrical signals, and (4) a plurality of fourth photoelectric conversion elements for converting light not comprising red, green and blue light of the optical signal into electrical signals, said first, second, third and fourth photoelectric conversion elements being arranged in a line in a predetermined alternating order, wherein said information processing apparatus has at least one of the following:

(a) means for inputting in parallel the electric signals converted by said first, second, third and fourth photoelectric conversion elements, and for outputting in serial the electric signals from one output line;

(b) means for inputting in parallel the electric signals converted by said first, second and third photoelectric conversion elements, and for outputting in serial the electric signals from at least one output line, and means for inputting in parallel only the electric signals converted by said fourth photoelectric conversion elements, and for outputting the input electric signals converted by said fourth photoelectric conversion elements from one output line serially; and (c) means for inputting in parallel the electric signals converted by said first, second, third and fourth photoelectric conversion elements, and for outputting the respective electric signals in serial to one of four output lines arranged in parallel.

6. An image information processing apparatus according to claim 5, further comprising:

image forming means for forming an image from the electrical signals of said first, second and third photoelectric conversion elements;

discrimination means for discriminating the electrical signals of said fourth photoelectric conversion elements from a reference signal; and control means for controlling an operation of said image forming means based on an output from said discrimination means.

7. An image information processing apparatus comprising:

illumination means for illuminating an original to obtain an optical signal; and image pickup means for picking up the optical signal, said image pickup means comprising (1) a plurality of first photoelectric conversion elements for converting light of a first visible wavelength region of the optical signal into electrical signals, (2) a plurality of second photoelectric conversion elements for converting light of a second visible wavelength region of the optical signal different from the first visible wavelength region into electrical signals, (3) a plurality of third photoelectric conversion elements for converting light of a third visible wavelength region of the optical signal different from the first and second visible wavelength regions into electrical signals, and (4) a plurality of fourth photoelectric conversion elements for converting non-visible light of the optical signal into electrical signals, said first, second, third and fourth photoelectric conversion elements being arranged in a line in a predetermined alternative order, wherein said information processing apparatus has at least one of the following:

(a) means for inputting in parallel the electric signals converted by said first, second, third and fourth photoelectric conversion elements, and for outputting in serial the electric signals from one output line;

(b) means for inputting in parallel the electric signals converted by said first, second and third photoelectric conversion elements, and for outputting in serial the electric signals from at least one output line, and means for inputting in parallel only the electric signals converted by said fourth photoelectric conversion elements, and for outputting the input electric signals converted by said fourth photoelectric conversion elements from one output line serially; and (c) means for inputting in parallel the electric signals converted by said first, second, third and fourth photoelectric conversion elements, and for outputting the respective electric signals in serial to one of four output lines arranged in parallel.

8. An image information processing apparatus according to claim 7, further comprising:

image forming means for forming an image from the electrical signals of said first, second and third photoelectric conversion elements;

discrimination means for discriminating the electrical signals of said fourth photoelectric conversion elements from a reference signal; and control means for controlling an operation of said image forming means based on an output from said discrimination means.

* * * * *

UNITED STATES PATENT AND TRADEMARK OFFICE
CERTIFICATE OF CORRECTION

PATENT NO. : 5,801,373
DATED : September 1, 1998
INVENTOR(S) : HAYAO OOZU, ET AL.

It is certified that error appears in the above-identified patent and that said Letters Patent is hereby corrected as shown below:

COLUMN 1
Line 19, "a invisible" should read --an invisible--;
Line 31, "a invisible" should read --an invisible--;
Line 35, "a invisible" should read --an invisible--;
Line 44, "a invisible" should read --an invisible--;
Line 53, "a invisible" should read --an invisible--.

COLUMN 3
Line 50, "in light" should read --light--.

COLUMN 11
Line 59, "man," should read --a person,--.

COLUMN 12
Line 50, "a different" should read --a difference--;

COLUMN 18
Line 43, "an non-" should read --a non- --.

Signed and Sealed this

First Day of June, 1999

Attest:

Attesting Officer

Q. TODD DICKINSON

Acting Commissioner of Patents and Trademarks